United States Patent
Kamimura

(10) Patent No.: US 12,554,201 B2
(45) Date of Patent: Feb. 17, 2026

(54) LIQUID CHEMICAL AND METHOD FOR PRODUCING LIQUID CHEMICAL

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 494 days.

(21) Appl. No.: 16/910,250

(22) Filed: Jun. 24, 2020

(65) Prior Publication Data

US 2020/0319559 A1 Oct. 8, 2020

Related U.S. Application Data

(63) Continuation of application No. PCT/JP2019/000340, filed on Jan. 9, 2019.

(30) Foreign Application Priority Data

Jan. 12, 2018 (JP) ................ 2018-003582

(51) Int. Cl.
| | | |
|---|---|---|
| G03F 7/32 | (2006.01) | |
| C08F 220/68 | (2006.01) | |
| G03F 7/11 | (2006.01) | |
| G03F 7/20 | (2006.01) | |
| H01L 21/027 | (2006.01) | |

(52) U.S. Cl.
CPC ............ *G03F 7/325* (2013.01); *C08F 220/68* (2013.01); *G03F 7/11* (2013.01); *G03F 7/2004* (2013.01); *H01L 21/0274* (2013.01)

(58) Field of Classification Search
CPC .............. G03F 7/325; G03F 7/085; G03F 7/32
See application file for complete search history.

(56) References Cited

U.S. PATENT DOCUMENTS

| | | | | |
|---|---|---|---|---|
| 2007/0098883 A1* | 5/2007 | Itoh | .................. | H01B 1/22 427/256 |
| 2008/0224126 A1* | 9/2008 | Sen | .................. | B82Y 30/00 257/40 |
| 2011/0281070 A1* | 11/2011 | Mittal | .................. | B05D 3/007 428/221 |
| 2015/0064625 A1 | 3/2015 | Ogihara et al. | | |

FOREIGN PATENT DOCUMENTS

| | | | | | |
|---|---|---|---|---|---|
| JP | 2004-241294 A | * | 8/2004 | ............... | H01B 1/22 |
| JP | 4058267 B2 | * | 3/2008 | ............... | C01G 1/00 |
| JP | 2009-529004 | * | 8/2009 | ............. | A61K 47/48 |
| JP | 2011-038134 A | * | 2/2011 | ............... | B22F 1/00 |
| JP | 2013-218308 A | | 10/2013 | | |
| JP | 2015-049395 A | | 3/2015 | | |
| JP | 2016-073922 A | | 5/2016 | | |
| KR | 10-0869333 B1 | | 11/2008 | | |
| TW | I592988 B | | 7/2017 | | |
| WO | 2018/043697 A1 | | 3/2018 | | |

OTHER PUBLICATIONS

English Translation of Japanese Patent Publication No. 2011-038134 (Hata N et al) (Year: 2011).*
English Translation of Japanese Patent No. 4058267 (Hirai Hiroyuki) (Year: 2008).*
English Translation of Japanese Patent Publication No. 2009-529004 (Year: 2009).*
English Translation of JP2004-241294A (Year: 2004).*
International Search Report dated Mar. 19, 2019 from the International Searching Authority in International Application No. PCT/JP2019/000340.
International Preliminary Report on Patentability dated Jul. 14, 2020 from the International Bureau in International Application No. PCT/JP2019/000340.
Written Opinion dated Mar. 19, 2019 from the International Bureau in International Application No. PCT/JP2019/000340.
Notice of Reason for Refusal dated Aug. 3, 2021 from the Japanese Patent Office in JP Application No. 2019-564718.
Office Action issued Nov. 1, 2021 in Korean Application No. 10-2020-7015665.
Communication dated Apr. 27, 2022 from the Taiwanese Patent Office in Taiwanese Application No. 108100948.
Office Action dated Aug. 2, 2022 from the Korean Intellectual Property Office in Korean Application No. 10-2020-7015665.
Office Action dated Mar. 15, 2023 from the Korean Patent Office in Application No. 10-2023-7004982.
Office Action dated Dec. 2, 2022 from the China National Intellectual Property Administration in CN Application No. 201980006863.0.
Chinese Office Action dated May 24, 2023 in Chinese Application No. 201980006863.0.
Office Action issued May 7, 2024 in Japanese Application No. 2022-179679.

\* cited by examiner

*Primary Examiner* — Daborah Chacko-Davis
(74) *Attorney, Agent, or Firm* — Sughrue Mion, PLLC

(57) ABSTRACT

An object of the present invention is to provide a liquid chemical exhibiting excellent defect inhibitive performance even in a case of being applied to a resist process by EUV exposure. Another object thereof is to provide a method for producing a liquid chemical. The liquid chemical of the present invention includes an organic solvent; Fe nanoparticles containing a Fe atom and having a particle size of 0.5 to 17 nm; and Pb nanoparticles containing a Pb atom and having a particle size of 0.5 to 17 nm, in which a ratio of the number of the Fe nanoparticles contained to the number of the Pb nanoparticles contained is 1.0 to $1.0 \times 10^4$, based on the number of the particles per unit volume of the liquid chemical.

20 Claims, 1 Drawing Sheet

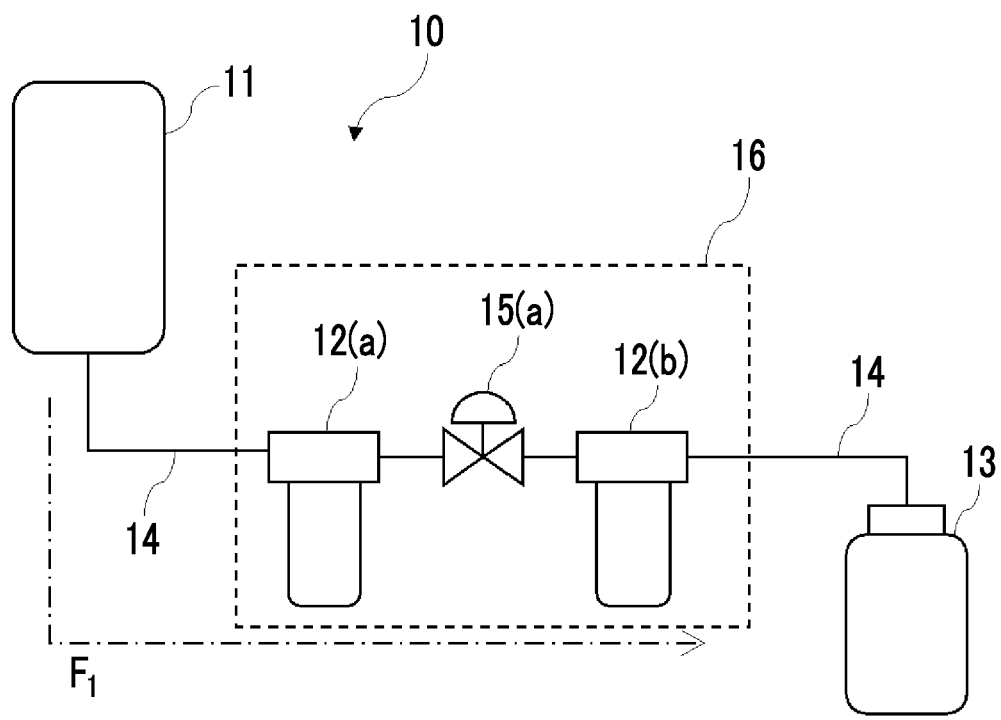

LIQUID CHEMICAL AND METHOD FOR PRODUCING LIQUID CHEMICAL

CROSS-REFERENCE TO RELATED APPLICATIONS

This application is a Continuation of PCT International Application No. PCT/JP2019/000340 filed on Jan. 9, 2019, which claims priority under 35 U.S.C. § 119(a) to Japanese Patent Application No. 2018-003582 filed on Jan. 12, 2018. Each of the above applications is hereby expressly incorporated by reference, in its entirety, into the present application.

BACKGROUND OF THE INVENTION

1. Field of the Invention

The present invention relates to a liquid chemical and a method for producing a liquid chemical.

2. Description of the Related Art

In a case of manufacturing a semiconductor device by a wiring forming step including photolithography, a liquid chemical containing water and/or an organic solvent is used as a pre-wetting solution, a resist solution (a resist composition), a developer, a rinsing solution, a peeling solution, a slurry for chemical mechanical polishing (CMP), and a cleaning liquid or the like after CMP, or as a dilute solution therefor.

In recent years, miniaturization of patterns has been progressing in accordance with progress of photolithography technology. As a method of miniaturizing patterns, a method of shortening a wavelength of an exposure light source is used. Attempts have been made to form patterns using extreme ultraviolet (EUV) having a shorter wavelength as an exposure light source instead of ultraviolet rays, a KrF excimer laser, an ArF excimer laser, and the like which were used in the related art.

Development is in progress for the pattern formation by EUV or the like while aiming at a resist pattern width of 10 to 15 nm, and the above-mentioned liquid chemical used in this process is required to further exhibit defect inhibitive performance.

As a method for producing a liquid chemical used in pattern formation of the related art, JP2015-049395A discloses "a method for producing a resist composition used in a step of manufacturing a semiconductor device, the method including: cleaning a manufacturing device for a resist composition with a cleaning liquid; removing the cleaning liquid from the manufacturing device to be spin-applied to a substrate for evaluation; cleaning the substrate for evaluation until changes in defect density of defects having a size of 100 nm or more in the substrate for evaluation before and after application become 0.2 defects/cm$^2$ or less; and thereafter, producing a resist composition by the manufacturing device." JP2015-049395A discloses that pattern defects and the like were inhibited in a case where ArF exposure was performed using a liquid chemical (resist composition) produced by this method.

SUMMARY OF THE INVENTION

The inventors of the present invention have found that defects are generated in a case where patterns are formed by EUV exposure using a resist composition containing a liquid chemical produced by the above production method.

Accordingly, an object of the present invention is to provide a liquid chemical from which defects are hardly generated even in a case where the liquid chemical is applied to a resist process by EUV exposure, in other words, a liquid chemical exhibiting excellent defect inhibitive performance even in a case of being applied to a resist process by EUV exposure.

Another object of the present invention is to provide a method for producing a liquid chemical.

The inventors of the present invention have conducted intensive studies to achieve the above-mentioned objects, and as a result, they have found that the above-mentioned objects can be achieved by the following configurations.

[1] A liquid chemical comprising: an organic solvent; Fe nanoparticles containing a Fe atom and having a particle size of 0.5 to 17 nm; and Pb nanoparticles containing a Pb atom and having a particle size of 0.5 to 17 nm, in which a ratio of the number of the Fe nanoparticles contained to the number of the Pb nanoparticles contained is 1.0 to $1.0 \times 10^4$, based on the number of the particles per unit volume of the liquid chemical.

[2] The liquid chemical according to [1], further comprising Cr nanoparticles containing a Cr atom and having a particle size of 0.5 to 17 nm, in which a ratio of the number of the Fe nanoparticles contained to the number of the Cr nanoparticles contained is 1.0 to $1.0 \times 10^4$, based on the number of the particles per unit volume of the liquid chemical.

[3] The liquid chemical according to [1] or [2], further comprising Ti nanoparticles containing a Ti atom and having a particle size of 0.5 to 17 nm, in which a ratio of the number of the Fe nanoparticles contained to the number of the Ti nanoparticles contained is 1.0 to $1.0 \times 10^3$, based on the number of the particles per unit volume of the liquid chemical.

[4] The liquid chemical according to any one of [1] to [3], which is for manufacturing a semiconductor device.

[5] The liquid chemical according to any one of [1] to [4], in which the Fe nanoparticles consist of at least one selected from the group consisting of particles A consisting of a simple substance of Fe, particles B consisting of an oxide of a Fe atom, and particles C consisting of a simple substance of Fe and an oxide of a Fe atom.

[6] The liquid chemical according to [5], in which a ratio of the number of the particles A contained to a total of the number of the particles B contained and the number of the particles C contained is less than 1.0, based on the number of the particles per unit volume of the liquid chemical.

[7] The liquid chemical according to [6], in which the ratio of the number of the particles contained is $1.0 \times 10^{-1}$ or less.

[8] The liquid chemical according to any one of [1] to [7], further comprising an organic compound having a boiling point of 300° C. or higher.

[9] The liquid chemical according to [8], in which at least some of the Fe nanoparticles are particles U containing the organic compound.

[10] The liquid chemical according to [8] or [9], in which at least some of the Fe nanoparticles are the particles U containing the organic compound and particles V not containing the organic compound, and a ratio of the number of the particles U contained to the number of the particles V contained is $1.0 \times 10^1$ or more, based on the number of the particles per unit volume of the liquid chemical.

[11] A method for producing a liquid chemical, which is for producing the liquid chemical according to any one of [1] to [10], the method comprising a filtration step of filtering a purification target substance containing an organic solvent using a filter to obtain the liquid chemical.

[12] The method for producing a liquid chemical according to [11], in which the filtration step is a multi-stage filtration step in which the purification target substance is passed through two or more kinds of filters different in at least one selected from the group consisting of a filter material, a pore diameter, and a pore structure.

[13] The method for producing a liquid chemical according to [11] or [12], in which, for the filter, in a case of using one filter, a pore diameter of the filter is 5 nm or smaller, and in a case of using two or more filters, a pore diameter of a filter having a smallest pore diameter among the filters is 5 nm or smaller.

According to the present invention, it is possible to provide a liquid chemical exhibiting excellent defect inhibitive performance even in a case of being applied to a resist process by EUV exposure. Another object of the present invention is to provide a method for producing a liquid chemical.

BRIEF DESCRIPTION OF THE DRAWINGS

FIG. 1 is a schematic diagram showing a typical example of a purification device with which a multi-stage filtration step can be performed.

DESCRIPTION OF THE PREFERRED EMBODIMENTS

Hereinafter, the present invention will be described in detail.

The description of constituent elements described below can be made based on representative embodiments of the present invention, but the present invention is not limited to such embodiments.

Numerical value ranges expressed using "to" in the present specification mean a range including numerical values described before and after "to" as the lower limit value and the upper limit value.

In addition, in the present invention, "ppm" means "parts-per-million ($10^{-6}$)," "ppb" means "parts-per-billion ($10^{-9}$)," "ppt" means "parts-per-trillion ($10^{-12}$)," and "ppq" means "parts-per-quadrillion ($10^{-15}$)."

Furthermore, in the indication of a group (atomic group) in the present invention, the indication not including substitution or unsubstitution includes those having a substituent and also those not having a substituent within a range not impairing effects of the present invention. For example, a "hydrocarbon group" refers to not only a hydrocarbon group not having a substituent (unsubstituted hydrocarbon group) but also a hydrocarbon group having a substituent (substituted hydrocarbon group). This also applies to each compound.

Furthermore, the term "radiation" in the present invention means, for example, far ultraviolet, extreme ultraviolet (EUV), X-rays, electron rays, and the like. Furthermore, in the present invention, light means active light rays or radiation. Unless otherwise specified, the term "exposure" in the present invention includes not only exposure to far ultraviolet, X-rays, EUV, or the like, but also lithography by particle beams such as electron rays or ion beams.

Liquid Chemical

A liquid chemical according to an embodiment of the present invention includes an organic solvent; Fe nanoparticles containing a Fe atom and having a particle size of 0.5 to 17 nm; and Pb nanoparticles containing a Pb atom and having a particle size of 0.5 to 17 nm, in which a ratio of the number of the Fe nanoparticles contained to the number of the Pb nanoparticles contained is 1.0 to $1.0 \times 10^4$, based on the number of the particles per unit volume of the liquid chemical. Although the mechanism by which the objects of the present invention are achieved by the present liquid chemical is not necessarily clarified, the inventors of the present invention presume the mechanism as follows. The following mechanism is presumption, and even in a case where the objects of the present invention are achieved by a mechanism other than the following mechanism, this is included in the scope of the present invention.

The inventors of the present invention have intensively studied causes why defects are generated in a case where a liquid chemical is applied to a resist process by EUV exposure. As a result, they have discovered for the first time that, among particles contained in the liquid chemical which have a particle size of 0.5 to 17 nm and contain a metal atom, particles containing a Fe atom (Fe nanoparticles) have unique properties as compared to particles containing other metal atoms, and this affects defect inhibitive performance of the liquid chemical.

In a process to which EUV exposure is applied, there is a demand for narrowing a pattern space and a pattern width of a resist, and a pitch of a pattern which is obtained by totalling one pattern width and one pattern space and in which these pattern width and space are periodically arranged; and a space and a width of a manufactured wiring, and a pitch of a wiring which is obtained by totalling one wiring width and one wiring space and in which these wiring width and space are periodically arranged.

Specifically, in many cases, a pattern width and/or a pattern space is about 10 to 15 nm (in this case, a pattern pitch is 20 to 30 nm in many cases). In such a case, the inventors of the present invention have found that controlling of finer particles by unit of the number of particles is required, which has not been a problem in a process of the related art.

Among the above-mentioned particles, because metal-containing particles having a particle size of smaller than 0.5 nm aggregate more easily and form coarse particles as a result in many cases, these particles are removed (for example, in a form of being washed away) during a process in many cases. Accordingly, it is presumed that an influence of these particles on defect inhibitive performance of the liquid chemical is not so large.

Meanwhile, among the above-mentioned particles, because metal-containing particles having a particle size of larger than 17 nm are sufficiently large as compared to a required resist pitch, these particles are removed during a process as described above. Accordingly, it is presumed that an influence of these particles on defect inhibitive performance of the liquid chemical is not so large.

Among the particles, according to the findings obtained by the inventors of the present invention, in a liquid chemical, Fe nanoparticles associate with an organic compound in many cases as compared with nanoparticles containing other atoms (particularly, Pb nanoparticles).

The inventors of the present invention have found that an organic compound in a free state which is present in a liquid chemical causes defects called spot-like defects. Accordingly, it is presumed that generation of spot-like defects can be inhibited by controlling a content of Fe nanoparticles in the liquid chemical. In other words, by setting the number of Fe nanoparticles contained which associate with an organic compound more easily to 1.0 or more with respect to the number of Pb nanoparticles contained which are present as a state of not associating with an organic compound in the liquid chemical in many cases, it is possible to appropriately reduce an amount of organic compounds in a free state (among compounds, a high-boiling point organic compound to be described later) in the liquid chemical can be reduced appropriately, as a result, the liquid chemical exhibits excellent defect inhibitive performance (particularly, spot-like defect inhibitive performance).

In addition, it is presumed that Pb nanoparticles, which are present as a state of not associating with an organic compound in the liquid chemical in many cases, have a property allowing particles to be easily aggregated with each other by metal bonding in a case where the liquid chemical is applied to a substrate, and the like. It is presumed that aggregated particles are a factor that deteriorates uniformity of a pattern width. In the liquid chemical according to the embodiment of the present invention, since the number of Fe nanoparticles contained with respect to the number of Pb nanoparticles contained was set to 1.0 or more, a content of Pb nanoparticles that are relatively easily aggregated is controlled to a certain value or less, and thereby the liquid chemical exhibits more excellent defect inhibitive performance (particularly, pattern width uniform performance).

Meanwhile, in a case where Fe/Pb is $1.0 \times 10^4$ or less, the liquid chemical exhibits excellent residue defect inhibitive performance and excellent bridge defect inhibitive performance. Fe has a smaller standard oxidation-reduction potential than Pb, and thus is likely to be present as an ion in the liquid chemical. Meanwhile, it is presumed that such Fe ions easily react with dissolved oxygen in the liquid chemical and become oxides, thereby causing residue defects. In addition, the above-described residues are considered to cause bridge defects at the case of development. The liquid chemical has a Fe/Pb of $1.0 \times 10^4$ or less, and therefore it exhibits excellent residue defect inhibitive performance and excellent bridge defect inhibitive performance.

[Organic Solvent]

The liquid chemical includes the organic solvent. A content of the organic solvent in the liquid chemical is not particularly limited, but in general, it is preferably 98.0% by mass or more, more preferably 99.0% by mass or more, even more preferably 99.9% by mass or more, and particularly preferably 99.99% by mass or more with respect to a total mass of the liquid chemical. The upper limit thereof is not particularly limited but is less than 100% by mass in many cases.

As the organic solvent, one kind thereof may be used alone, or two or more kinds thereof may be used in combination. In a case where two or more kinds of organic solvents are used in combination, a total content thereof is preferably within the above-mentioned range.

In the present specification, the organic solvent means a liquid organic compound contained at a content of more than 10,000 ppm by mass per component with respect to a total mass of the liquid chemical. That is, in the present specification, a liquid organic compound contained at a content of more than 10,000 ppm by mass with respect to a total mass of the liquid chemical corresponds to the organic solvent.

In the present specification, the term "liquid" means a substance that is liquid at 25° C. and atmospheric pressure.

The type of the organic solvent is not particularly limited, and known organic solvents can be used. Examples of organic solvents include alkylene glycol monoalkyl ether carboxylate, alkylene glycol monoalkyl ether, lactic acid ethyl ester, alkyl alkoxypropionate, cyclic lactone (preferably having 4 to 10 carbon atoms), a monoketone compound (preferably having 4 to 10 carbon atoms) which may have a ring, alkylene carbonate, alkyl alkoxyacetate, alkyl pyruvate, and the like.

As the organic solvent, for example, those disclosed in JP2016-057614A, JP2014-219664A, JP2016-138219A, and JP2015-135379A may be used.

As the organic solvent, at least one selected from the group consisting of propylene glycol monomethyl ether, propylene glycol monoethyl ether (PGME), propylene glycol monopropyl ether, propylene glycol monomethyl ether acetate (PGMEA), ethyl lactate (EL), methyl methoxypropionate, cyclopentanone, cyclohexanone (CHN), γ-butyrolactone, diisoamyl ether, butyl acetate (nBA), isoamyl acetate, isopropanol, 4-methyl-2-pentanol, dimethyl sulfoxide, N-methyl-2-pyrrolidone, diethylene glycol, ethylene glycol, dipropylene glycol, propylene glycol, ethylene carbonate, propylene carbonate (PC), sulfolane, cycloheptanone, 1-hexanol, decane, and 2-heptanone is preferable. Among the above examples, CHN, PGMEA, PGME, nBA, PC, and a mixture thereof are preferable from the viewpoint that then, it is possible to obtain a liquid chemical exhibiting more excellent effects of the present invention.

As the organic solvent, one kind thereof may be used alone, or two or more kinds thereof may be used in combination.

The type and a content of the organic solvent in the liquid chemical can be measured using a gas chromatography mass spectrometer.

[Fe Nanoparticles]

The liquid chemical includes Fe nanoparticles. The Fe nanoparticles are particles containing a Fe atom and having a particle size of 0.5 to 17 nm. A content of the Fe nanoparticles in the liquid chemical is not particularly limited, but in general, it is preferably $1.0 \times 10^4$ to $1.0 \times 10^7$ particles/cm$^3$, and more preferably $1.0 \times 10^5$ to $1.0 \times 10^6$ particles/cm$^3$. In a case where a content of the Fe nanoparticles in the liquid chemical is within the above range, the liquid chemical exhibits more excellent effects of the present invention.

A content of the Fe nanoparticles in the liquid chemical can be measured by a method described in Examples, and the particle number (the number of particles) of the Fe nanoparticles per unit volume of the liquid chemical is obtained by rounding off to two significant figures. Also for Pb nanoparticles, Cr nanoparticles, and Ti nanoparticles to be described later, the number of particles per unit volume is obtained by the same rounding process described above.

As long as the Fe nanoparticles contain a Fe atom, a form thereof is not particularly limited. Examples of forms include a simple substance of Fe, a compound containing a Fe atom (hereinafter, also referred to as a "Fe compound"), a complex thereof, and the like. In addition, the Fe nanoparticles may contain metal atoms other than Fe. The Fe nanoparticles refer to particles in which a content (atomic %) of Fe atoms is largest among all atoms contained in the particles. A method of elemental analysis of particles is as described in Examples.

The complex is not particularly limited, and examples thereof include a so-called core-shell type particles having a simple substance of Fe, and a Fe compound that covers at least a part of the above-mentioned simple substance of Fe; solid solution particles containing a Fe atom and other atoms; eutectic particles containing a Fe atom and other atoms; aggregate particles of a simple substance of Fe and a Fe compound; aggregate particles of different types of Fe compounds; a Fe compound of which a composition changes continuously or intermittently from a particle surface toward the center; and the like.

The atom other than a Fe atom contained in a Fe compound is not particularly limited, and examples thereof include a carbon atom, an oxygen atom, a nitrogen atom, a hydrogen atom, a sulfur atom, a phosphorus atom, and the like. Among the examples, an oxygen atom is preferable. A form of incorporating an oxygen atom to a Fe compound is not particularly limited, but an oxide of a Fe atom is more preferable.

The Fe nanoparticles preferably consist of at least one selected from the group consisting of particles A consisting of a simple substance of Fe, particles B consisting of an oxide of a Fe atom, and particles C consisting of a simple substance of Fe and an oxide of a Fe atom, from the viewpoint that then, it is possible to obtain a liquid chemical exhibiting more excellent effects of the present invention. That is, the Fe nanoparticles preferably contain the particles A, and more preferably consist of the particles A, the particles B, and/or the particles C. A ratio of the number of the particles A contained, the number of the particles B contained, and the number of the particles C contained in the Fe nanoparticles (based on the number of the particles per unit volume of the liquid chemical) is not particularly limited, but a ratio (hereinafter, also referred to as A/(B+C)) of the number of the particles A contained to a total of the number of the particles B contained and the number of the particles C contained is preferably 1.5 or less, more preferably less than 1.0, even more preferably 0.20 or less, and particularly preferably $1.0 \times 10^{-1}$ or less; and is preferably $1.0 \times 10^{-3}$ or more and more preferably $1.0 \times 10^{-2}$ or more, from the viewpoint that then, it is possible to obtain a liquid chemical exhibiting more excellent effects of the present invention.

In a case where A/(B+C) is less than 1.0, the liquid chemical exhibits more excellent defect inhibitive performance (residue defect inhibitive performance, bridge defect inhibitive performance, pattern width uniform performance, and spot-like defect inhibitive performance).

[Pb Nanoparticles]

The liquid chemical includes Pb nanoparticles. The Pb nanoparticles are particles containing a Pb atom and having a particle size of 0.5 to 17 nm. A content of the Pb nanoparticles in the liquid chemical is not particularly limited, but in general, it is preferably 1.0 to $1.0 \times 10^5$ particles/cm$^3$, more preferably $1.0 \times 10^1$ to $8.0 \times 10^4$ particles/cm$^3$, even more preferably $1.0 \times 10^1$ to $5.0 \times 10^4$ particles/cm$^3$, particularly preferably $1.0 \times 10^1$ to $3.0 \times 10^4$ particles/cm$^3$, and most preferably $1.0 \times 10^1$ to $5.0 \times 10^3$ particles/cm$^3$.

In a case where a content of the Pb nanoparticles in the liquid chemical is $1.0 \times 10^1$ to $8.0 \times 10^4$ particles/cm$^3$, the liquid chemical exhibits more excellent residue defect inhibitive performance, more excellent pattern width uniform performance, and more excellent spot-like defect inhibitive performance.

In addition, in a case where a content of the Pb nanoparticles in the liquid chemical is $1.0 \times 10^1$ to $5.0 \times 10^4$ particles/cm$^3$, the liquid chemical exhibits more excellent bridge defect inhibitive performance.

Furthermore, in a case where a content of the Pb nanoparticles in the liquid chemical is $1.0 \times 10^1$ to $3.0 \times 10^4$ particles/cm$^3$, the liquid chemical exhibits more excellent residue defect inhibitive performance, more excellent pattern width uniform performance, and more excellent spot-like defect inhibitive performance.

Furthermore, in a case where a content of the Pb nanoparticles in the liquid chemical is $1.0 \times 10^1$ to $5.0 \times 10^3$ particles/cm$^3$, the liquid chemical exhibits more excellent bridge defect inhibitive performance.

A content of the Pb nanoparticles in the liquid chemical can be measured by a method described in Examples.

As long as the Pb nanoparticles contain a Pb atom, a form thereof is not particularly limited. Examples of forms include a simple substance of Pb, a compound containing a Pb atom (hereinafter, also referred to as a "Pb compound"), a complex thereof, and the like. In addition, the Pb nanoparticles may contain metal atoms other than Pb. The Pb nanoparticles refer to particles in which a content (atomic %) of Pb atoms is largest among all atoms contained in the particles. A method of elemental analysis of particles is as described in Examples.

The complex is not particularly limited, and examples thereof include a so-called core-shell type particles having a simple substance of Pb, and a Pb compound that covers at least a part of the above-mentioned simple substance of Pb; solid solution particles containing a Pb atom and other atoms; eutectic particles containing a Pb atom and other atoms; aggregate particles of a simple substance of Pb and a Pb compound; aggregate particles of different types of Pb compounds; a Pb compound of which a composition changes continuously or intermittently from a particle surface toward the center; and the like.

The atom other than a Pb atom contained in a Pb compound is not particularly limited, and examples thereof include a carbon atom, an oxygen atom, a nitrogen atom, a hydrogen atom, a sulfur atom, a phosphorus atom, and the like. Among the examples, an oxygen atom is preferable. A form of incorporating an oxygen atom to a Pb compound is not particularly limited, but an oxide of a Pb atom is more preferable.

A ratio (hereinafter also referred to as a "Fe/Pb") of the number of the Fe nanoparticles contained to the number of the Pb nanoparticles contained (particles/cm$^3$) based on the number of the particles per unit volume of the liquid chemical is 1.0 to $1.0 \times 10^4$, is preferably 3.0 to $1.5 \times 10^3$, and is more preferably $1.0 \times 10^1$ to $2.0 \times 10^2$.

In a case where a Fe/Pb is 3.0 or more, the liquid chemical exhibits more excellent residue defect inhibitive performance, more excellent bridge defect inhibitive performance, more excellent pattern width uniform performance, and more excellent spot-like defect inhibitive performance.

In a case where a Fe/Pb is $1.0 \times 10^1$ or more, the liquid chemical exhibits more excellent residue defect inhibitive performance, more excellent pattern width uniform performance, and more excellent spot-like defect inhibitive performance.

In a case where a Fe/Pb is $1.5 \times 10^3$ or less, the liquid chemical exhibits more excellent residue defect inhibitive performance, more excellent bridge defect inhibitive performance, more excellent pattern width uniform performance, and more excellent spot-like defect inhibitive performance.

In a case where a Fe/Pb is $2.0 \times 10^2$ or less, the liquid chemical exhibits more excellent residue defect inhibitive performance, more excellent bridge defect inhibitive performance, more excellent pattern width uniform performance, and more excellent spot-like defect inhibitive performance.

A Fe/Pb is obtained by rounding off to two significant figures. The same applies to Fe/Cr, Fe/Ti, A/(B+C), and U/V.

Other Components

The liquid chemical may include other components other than the above-described components. Examples of other components include Cr nanoparticles, Ti nanoparticles, organic compounds other than the organic solvent (particularly, an organic compound having a boiling point of 300° C. or higher), water, resins, and the like.

Cr Nanoparticles

The liquid chemical preferably includes Cr nanoparticles. The Cr nanoparticles are particles containing a Cr atom and having a particle size of 0.5 to 17 nm. The number of the Cr nanoparticles contained in the liquid chemical is not particularly limited, but in general, it is preferably 1.0 to $1.0 \times 10^6$ particles/cm$^3$, more preferably 1.5 to $1.0 \times 10^5$ particles/cm$^3$, even more preferably 1.5 to $4.5 \times 10^4$ particles/cm$^3$, particularly preferably $1.0 \times 10^2$ to $1.5 \times 10^4$ particles/cm$^3$, and most preferably $1.0 \times 10^3$ to $7.0 \times 10^3$ particles/cm$^3$.

In a case where the number of the Cr nanoparticles contained in the liquid chemical is 1.5 to $4.5 \times 10^4$ particles/cm$^3$, the liquid chemical exhibits more excellent residue defect inhibitive performance, more excellent bridge defect inhibitive performance, more excellent pattern width uniform performance, and more excellent spot-like defect inhibitive performance.

In a case where the number of the Cr nanoparticles contained in the liquid chemical is $1.0 \times 10^2$ to $1.5 \times 10^4$ particles/cm$^3$, the liquid chemical exhibits more excellent residue defect inhibitive performance, more excellent pattern width uniform performance, and more excellent spot-like defect inhibitive performance.

In a case where the number of the Cr nanoparticles contained in the liquid chemical is $1.0 \times 10^3$ to $7.0 \times 10^3$ particles/cm$^3$, the liquid chemical exhibits particularly excellent bridge defect inhibitive performance.

The number of the Cr nanoparticles contained in the liquid chemical can be measured by a method described in Examples.

A ratio (hereinafter, also referred to as a "Fe/Cr") of the number of the Fe nanoparticles contained per unit volume of the liquid chemical to the number of the Cr nanoparticles contained (particles/cm$^3$) per unit volume of the liquid chemical is not particularly limited, but it is preferably $1.0 \times 10^{-1}$ to $2.0 \times 10^4$, more preferably 1.0 to $1.0 \times 10^4$, even more preferably 5.0 to $1.4 \times 10^3$, particularly preferably $1.0 \times 10^1$ to $1.0 \times 10^2$, and most preferably $5.0 \times 10^1$ to $1.0 \times 10^2$, from the viewpoint that then, a liquid chemical exhibiting more excellent effects of the present invention is obtained.

In a case where a Fe/Cr is 1.0 to $1.0 \times 10^4$, the liquid chemical exhibits more excellent bridge defect inhibitive performance.

In a case where a Fe/Cr is 5.0 to $1.4 \times 10^3$, the liquid chemical exhibits more excellent residue defect inhibitive performance, more excellent bridge defect inhibitive performance, more excellent pattern width uniform performance, and more excellent spot-like defect inhibitive performance.

In a case where a Fe/Cr is 10 to $1.0 \times 10^2$, the liquid chemical exhibits more excellent residue defect inhibitive performance, more excellent pattern width uniform performance, and more excellent spot-like defect inhibitive performance.

In a case where a Fe/Cr is 50 to $1.0 \times 10^2$, the liquid chemical exhibits more excellent bridge defect inhibitive performance.

A form of the Cr nanoparticle is not particularly limited, and examples of forms include a simple substance of Cr, a compound containing a Cr atom (hereinafter, also referred to as a "Cr compound"), a complex thereof, and the like. In addition, the Cr nanoparticles may contain metal atoms other than Cr. The Cr nanoparticles refer to particles in which a content (atomic %) of Cr atoms is largest among all atoms contained in the particles. A method of analyzing a composition of the particles is as described in Examples.

The complex is not particularly limited, and examples thereof include a so-called core-shell type particles having a simple substance of Cr, and a Cr compound that covers at least a part of the above-mentioned simple substance of Cr; solid solution particles containing a Cr atom and other atoms; eutectic particles containing a Cr atom and other atoms; aggregate particles of a simple substance of Cr and a Cr compound; aggregate particles of different types of Cr compounds; a Cr compound of which a composition changes continuously or intermittently from a particle surface toward the center; and the like.

The atom other than a Cr atom contained in a Cr compound is not particularly limited, and examples thereof include a carbon atom, an oxygen atom, a nitrogen atom, a hydrogen atom, a sulfur atom, a phosphorus atom, and the like. Among the examples, an oxygen atom is preferable. A form of incorporating an oxygen atom to a Cr compound is not particularly limited, but an oxide of a Cr atom is more preferable.

<Ti Nanoparticles>

The liquid chemical may include Ti nanoparticles. The Ti nanoparticles are particles containing a Ti atom and having a particle size of 0.5 to 17 nm. A content of the Ti nanoparticles in the liquid chemical is not particularly limited, but in general, it is preferably 1.0 to $3.0 \times 10^5$ particles/cm$^3$, more preferably $2.0 \times 10^2$ to $5.0 \times 10^4$ particles/cm$^3$, even more preferably $1.0 \times 10^3$ to $4.0 \times 10^5$ particles/cm$^3$, and particularly preferably $1.0 \times 10^3$ to $1.0 \times 10^5$ particles/cm$^3$.

In a case where a content of the Ti nanoparticles in the liquid chemical is $2.0 \times 10^2$ particles/cm$^3$ or more, the liquid chemical exhibits more excellent bridge defect inhibitive performance.

In a case where a content of the Ti nanoparticles in the liquid chemical is $1.0 \times 10^3$ particles/cm$^3$ or more, the liquid chemical exhibits more excellent residue defect inhibitive performance, more excellent bridge defect inhibitive performance, more excellent pattern width uniform performance, and more excellent spot-like defect inhibitive performance.

In a case where a content of the Ti nanoparticles in the liquid chemical is $5.0 \times 10^4$ particles/cm$^3$ or less, the liquid chemical exhibits more excellent residue defect inhibitive performance, more excellent bridge defect inhibitive performance, more excellent pattern width uniform performance, and more excellent spot-like defect inhibitive performance.

In a case where a content of the Ti nanoparticles in the liquid chemical is $4.0 \times 10^5$ particles/cm$^3$ or less, the liquid chemical exhibits more excellent residue defect inhibitive performance, more excellent pattern width uniform performance, and more excellent spot-like defect inhibitive performance.

In a case where a content of the Ti nanoparticles in the liquid chemical is $1.0 \times 10^5$ particles/cm$^3$ or less, the liquid chemical exhibits particularly excellent bridge defect inhibitive performance.

A ratio (hereinafter, also referred to as a "Fe/Ti") of the number of the Fe nanoparticles contained per unit volume of the liquid chemical to the number of the Ti nanoparticles contained (particles/cm$^3$) per unit volume of the liquid chemical is not particularly limited, but it is preferably $1.0 \times 10^{-1}$ to $2.0 \times 10^4$, more preferably 1.0 to $1.0 \times 10^3$, even more preferably 3.0 to $1.0 \times 10^2$, and particularly preferably 4.0 to $1.0 \times 10^2$, from the viewpoint that then, a liquid chemical exhibiting more excellent effects of the present invention is obtained.

In a case where a Fe/Ti in the liquid chemical is 1 or more, the liquid chemical exhibits more excellent bridge defect inhibitive performance.

In a case where a Fe/Ti in the liquid chemical is 3.0 or more, the liquid chemical exhibits more excellent residue defect inhibitive performance, more excellent bridge defect inhibitive performance, more excellent pattern width uniform performance, and more excellent spot-like defect inhibitive performance.

In a case where a Fe/Ti in the liquid chemical is 4.0 or more, the liquid chemical exhibits particularly excellent bridge defect inhibitive performance.

In a case where a Fe/Ti in the liquid chemical is $1.0 \times 10^3$ or less, the liquid chemical exhibits more excellent defect inhibitive performance.

In a case where a Fe/Ti in the liquid chemical is $1.0 \times 10^2$ or less, the liquid chemical exhibits more excellent residue defect inhibitive performance, more excellent bridge defect inhibitive performance, more excellent pattern width uniform performance, and more excellent spot-like defect inhibitive performance.

A form of the Ti nanoparticle is not particularly limited, and examples of forms include a simple substance of Ti, a compound containing a Ti atom (hereinafter, also referred to as a "Ti compound"), a complex thereof, and the like. In addition, the Ti nanoparticles may contain metal atoms other than Ti. The Ti nanoparticles refer to particles in which a content (atomic %) of Ti atoms is largest among all atoms contained in the particles. A method of elemental analysis of particles is as described in Examples.

The complex is not particularly limited, and examples thereof include a so-called core-shell type particles having a simple substance of Ti, and a Ti compound that covers at least a part of the above-mentioned simple substance of Ti; solid solution particles containing a Ti atom and other atoms; eutectic particles containing a Ti atom and other atoms; aggregate particles of a simple substance of Ti and a Ti compound; aggregate particles of different types of Ti compounds; a Ti compound of which a composition changes continuously or intermittently from a particle surface toward the center; and the like.

The atom other than a Ti atom contained in a Ti compound is not particularly limited, and examples thereof include a carbon atom, an oxygen atom, a nitrogen atom, a hydrogen atom, a sulfur atom, a phosphorus atom, and the like. Among the examples, an oxygen atom is preferable. A form of incorporating an oxygen atom to a Ti compound is not particularly limited, but an oxide of a Ti atom is more preferable.

<Organic Compound Other Than Organic Solvent>

The liquid chemical may include an organic compound other than the organic solvent (hereinafter, also referred to as a "specific organic compound"). In the present specification, the specific organic compound is a compound different from the organic solvent contained in the liquid chemical, and means an organic compound contained at a content of 10,000 mass ppm or less with respect to a total mass of the liquid chemical. That is, in the present specification, the organic compound contained at a content of 10,000 ppm by mass or less with respect to a total mass of the liquid chemical corresponds to the specific organic compound and does not correspond to the organic solvent.

In a case where a plurality of types of organic compounds are contained in the liquid chemical, and in a case where each of the organic compounds is contained at the above-mentioned content of 10,000 mass ppm or less, the respective organic compounds correspond to the specific organic compound.

The specific organic compound may be added to the liquid chemical or may be unintentionally mixed in a step of producing the liquid chemical. Examples of cases in which the specific organic compound is unintentionally mixed in a step of producing the liquid chemical include a case in which the specific organic compound is contained in a raw material (for example, an organic solvent) used for producing the liquid chemical, a case in which the specific organic compound is mixed (for example, contamination) in a step of producing the liquid chemical, and the like, but examples are not limited thereto.

A content of the specific organic compound in the liquid chemical can be measured using gas chromatography mass spectrometer (GCMS).

The number of carbon atoms of the specific organic compound is not particularly limited, but it is preferably 8 or more and more preferably 12 or more from the viewpoint that then, the liquid chemical exhibits more excellent effects of the present invention. The upper limit of the number of carbon atoms is not particularly limited, but it is preferably 30 or less.

The specific organic compound may be, for example, a by-product generated due to synthesis of the organic solvent and/or an unreacted raw material (hereinafter, also referred to as "by-product and the like"), and the like.

Examples of by-products and the like include compounds represented by Formulas I to V.

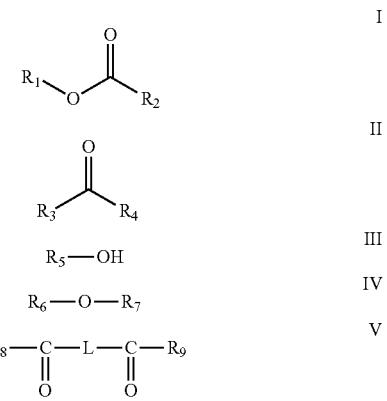

In Formula I, $R_1$ and $R_2$ each independently represent an alkyl group or a cycloalkyl group, or are bonded to each other to form a ring.

As an alkyl group or a cycloalkyl group represented by $R_1$ and $R_2$, an alkyl group having 1 to 12 carbon atoms or a cycloalkyl group having 6 to 12 carbon atoms is preferable, and an alkyl group having 1 to 8 carbon atoms or a cycloalkyl group having 6 to 8 carbon atoms is more preferable.

A ring to be formed by bonding of $R_1$ and $R_2$ to each other is a lactone ring, is preferably a 4- to 9-membered lactone ring, and is more preferably a 4- to 6-membered lactone ring.

$R_1$ and $R_2$ preferably satisfy a relationship in which the compound represented by Formula I has 8 or more carbon atoms.

In Formula II, $R_3$ and $R_4$ each independently represent a hydrogen atom, an alkyl group, an alkenyl group, a cycloalkyl group, or a cycloalkenyl group, or are bonded to each other to form a ring. Where not both $R_3$ and $R_4$ are hydrogen atoms.

As an alkyl group represented by $R_3$ and $R_4$, for example, an alkyl group having 1 to 12 carbon atoms is preferable, and an alkyl group having 1 to 8 carbon atoms is more preferable.

As an alkenyl group represented by $R_3$ and $R_4$, for example, an alkenyl group having 2 to 12 carbon atoms is preferable, and an alkenyl group having 2 to 8 carbon atoms is more preferable.

As a cycloalkyl group represented by $R_3$ and $R_4$, a cycloalkyl group having 6 to 12 carbon atoms is preferable, and a cycloalkyl group having 6 to 8 carbon atoms is more preferable.

As a cycloalkenyl group represented by $R_3$ and $R_4$, for example, a cycloalkenyl group having 3 to 12 carbon atoms is preferable, and a cycloalkenyl group having 6 to 8 carbon atoms is more preferable.

A ring to be formed by bonding of $R_3$ and $R_4$ to each other has a cyclic ketone structure, and it may be a saturated cyclic ketone or an unsaturated cyclic ketone. This cyclic ketone is preferably a 6- to 10-membered ring and more preferably a 6- to 8-membered ring.

$R_3$ and $R_4$ preferably satisfy a relationship in which the compound represented by Formula II has 8 or more carbon atoms.

In Formula III, $R_5$ represents an alkyl group or a cycloalkyl group.

An alkyl group represented by $R_5$ is preferably an alkyl group having 6 or more carbon atoms, more preferably an alkyl group having 6 to 12 carbon atoms, and even more preferably an alkyl group having 6 to 10 carbon atoms.

The alkyl group may have an ether bond in a chain, or may have a substituent such as a hydroxy group.

A cycloalkyl group represented by $R_5$ is preferably a cycloalkyl group having 6 or more carbon atoms, more preferably a cycloalkyl group having 6 to 12 carbon atoms, and even more preferably a cycloalkyl group having 6 to 10 carbon atoms.

In Formula IV, $R_6$ and $R_7$ each independently represent an alkyl group or a cycloalkyl group, or are bonded to each other to form a ring.

As an alkyl group represented by $R_6$ and $R_7$, an alkyl group having 1 to 12 carbon atoms is preferable, and an alkyl group having 1 to 8 carbon atoms is more preferable.

As a cycloalkyl group represented by $R_6$ and $R_7$, a cycloalkyl group having 6 to 12 carbon atoms is preferable, and a cycloalkyl group having 6 to 8 carbon atoms is more preferable.

A ring to be formed by bonding of $R_6$ and $R_7$ to each other has a cyclic ether structure. This cyclic ether structure is preferably a 4- to 8-membered ring and more preferably a 5- to 7-membered ring.

$R_6$ and $R_7$ preferably satisfy a relationship in which the compound represented by Formula IV has 8 or more carbon atoms.

In Formula V, $R_8$ and $R_9$ each independently represent an alkyl group or a cycloalkyl group, or are bonded to each other to form a ring. L represents a single bond or an alkylene group.

As an alkyl group represented by $R_8$ and $R_9$, for example, an alkyl group having 6 to 12 carbon atoms is preferable, and an alkyl group having 6 to 10 carbon atoms is more preferable.

As a cycloalkyl group represented by $R_8$ and $R_9$, a cycloalkyl group having 6 to 12 carbon atoms is preferable, and a cycloalkyl group having 6 to 10 carbon atoms is more preferable.

A ring to be formed by bonding of $R_8$ and $R_9$ to each other has a cyclic diketone structure. This cyclic diketone structure is preferably a 6- to 12-membered ring and more preferably a 6- to 10-membered ring.

As an alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the compound represented by Formula V has 8 or more carbon atoms.

Although not particularly limited, in a case where the organic solvent is an amide compound, an imide compound, and a sulfoxide compound, in one aspect, an amide compound, an imide compound, and a sulfoxide compound which have 6 or more carbon atoms are used. In addition, examples of specific organic compounds include the following compounds.

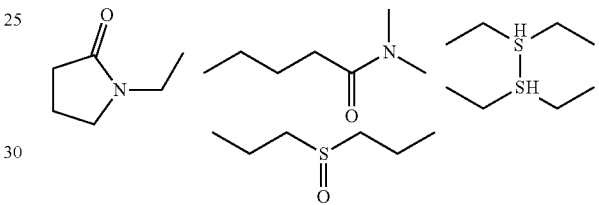

In addition, examples of specific organic compounds include antioxidants such as dibutylhydroxytoluene (BHT), distearyl thiodipropionate (DSTP), 4,4'-butylidenebis-(6-t-butyl-3-methylphenol), 2,2'-methylenebis-(4-ethyl-6-t-butylphenol), and an antioxidant disclosed in JP2015-200775A; unreacted raw materials; structural isomers and by-products produced during production of organic solvents; eluted substances (for example, a plasticizer eluted from a rubber member such as an O-ring) from members and the like constituting a production device for organic solvents; and the like.

Furthermore, examples of specific organic compounds include dioctyl phthalate (DOP), bis(2-ethylhexyl) phthalate (DEHP), bis(2-propylheptyl) phthalate (DPHP), dibutyl phthalate (DBP), benzyl butyl phthalate (BBzP), diisodecyl phthalate (DIDP), diisooctyl phthalate (DIOP), diethyl phthalate (DEP), diisobutyl phthalate (DIBP), dihexyl phthalate, diisononyl phthalate (DINP), tris(2-ethylhexyl) trimellitate (TEHTM), tris(n-octyl-n-decyl) trimellitate (ATM), bis(2-ethylhexyl) adipate (DEHA), monomethyl adipate (MMAD), dioctyl adipate (DOA), dibutyl sebacate (DBS), dibutyl maleate (DBM), diisobutyl maleate (DIBM), azelaic acid ester, benzoic acid ester, terephthalate (for example, dioctyl terephthalate (DEHT)), 1,2-cyclohexane dicarboxylic acid diisononyl ester (DINCH), epoxidized vegetable oils, sulfonamide (for example, N-(2-hydroxypropyl)benzenesulfonamide (HPBSA), N-(n-butyl)benzenesulfonamide (BBSA-NBBS)), organophosphate ester (for example, tricresyl phosphate (TCP), tributyl phosphate (TBP)), acetylated monoglyceride, triethyl citrate (TEC), acetyl triethyl citrate (ATEC), tributyl citrate (TBC), acetyl tributyl citrate (ATBC), trioctyl citrate (TOC), trioctyl acetyl citrate (ATOC), trihexyl citrate (THC), acetyl trihexyl citrate (ATHC), epoxidized soybean oil, ethylene propylene rubber, polybutene, an addition polymer of 5-ethylidene-2-norbornene, and polymer plasticizers exemplified below.

It is presumed that these specific organic compounds are mixed into a purification target substance or the liquid chemical from a filter, a pipe, a tank, an O-ring, a container, or the like which comes into contact therewith in a purification step. In particular, compounds other than alkyl olefins are associated generation of bridge defects.

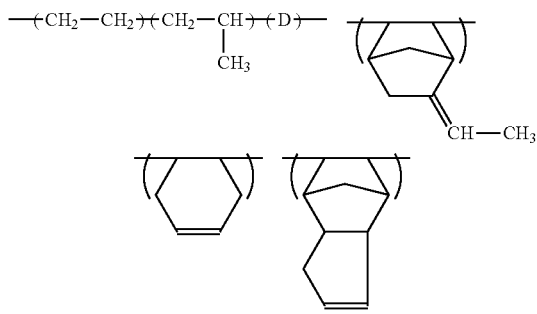

(Organic Compound Having Boiling Point of 300° C. or Higher)

The liquid chemical may include a specific organic compound having a boiling point of 300° C. or higher (a high-boiling point organic compound). In a case where the liquid chemical includes the organic compound having a boiling point of 300° C. or higher, it hardly volatilizes during a photolithography process because of a high boiling point. For this reason, it is necessary to strictly control a content, an existence form thereof, and the like of a high-boiling point organic compound in the liquid chemical to obtain a liquid chemical exhibiting excellent defect inhibitive performance.

As such high-boiling point organic compounds, for example, dioctyl phthalate (a boiling point of 385° C.), diisononyl phthalate (a boiling point of 403° C.), dioctyl adipate (a boiling point of 335° C.), dibutyl phthalate (a boiling point of 340° C.), ethylene propylene rubber (a boiling point of 300° C. to 450° C.), and the like have been confirmed.

The inventors of the present invention have found that there are various forms in a case where a high-boiling point organic compound is contained in the liquid chemical. Examples of existence forms of the high-boiling point organic compound in the liquid chemical include particles in which particles consisting of a metal atom or a metallic compound are aggregate with particles of a high-boiling point organic compound; particles in which particles consisting of a metal atom or a metallic compound, and a high-boiling point organic compound disposed to cover at least a part of the particles are included; particles formed by coordination bonding between a metal atom and a high-boiling point organic compound; and the like.

Among the examples, the Fe nanoparticles (particles U) containing an organic compound (preferably, a high-boiling point organic compound) are exemplified as a form having a large influence on defect inhibitive performance of the liquid chemical. The inventors of the present invention have found that defect inhibitive performance of the liquid chemical is dramatically improved by controlling a content of the particles U in the liquid chemical.

Although the reason for this is not necessarily clear, because the particles U contain an organic compound (preferably, a high-boiling point organic compound), surface free energy of the particles U easily becomes relatively lower than that of the Fe nanoparticles not containing the organic compound. Such particles U are unlikely to remain on a substrate that has been treated with the liquid chemical, and even in a case where the particles remain thereon, they are easily removed in a case where they come into contact with the liquid chemical again. For example, in a case where the liquid chemical is used as a developer and a rinsing solution, the particles U are further unlikely to remain on a substrate during development and are further more easily removed by rinsing or the like. That is, as a result, both particles containing an organic compound (preferably, a high-boiling point organic compound) and particles containing a Fe atom are more easily removed.

In addition, it is presumed that the particles U having lower surface energy are unlikely to remain on a substrate because a resist film is generally water-repellent in many cases.

According to the study of the inventors of the present invention, they have found that a liquid chemical exhibiting more excellent effects of the present invention is obtained by controlling the number of the particles V contained which do not contain an organic compound (preferably, a high-boiling point organic compound), and the number of the particles U contained per unit volume of the liquid chemical.

That is, a ratio of the number of the particles U contained to the number of the particles V contained based on the number of the particles per unit volume of the liquid chemical is preferably 10 or more, more preferably 100 or less, even more preferably 50 or less, still more preferably 35 or less, and particularly preferably 25 or less from the viewpoint that then, a liquid chemical exhibiting more excellent effects of the present invention is obtained.

<Water>

The liquid chemical may include water. Water is not particularly limited, and for example, distilled water, ion exchange water, pure water, and the like can be used. Water is not included in the above-mentioned organic impurities.

Water may be added to the liquid chemical or may be unintentionally mixed into the liquid chemical in a step of producing the liquid chemical. Examples of cases in which water is unintentionally mixed in a step of producing the liquid chemical include a case in which water is contained in a raw material (for example, an organic solvent) used for producing the liquid chemical, a case in which water is mixed (for example, contamination) in a step of producing the liquid chemical, and the like, but examples are not limited thereto.

A content of water in the liquid chemical is not particularly limited, but in general, it is preferably 0.05% to 2.0% by mass with respect to a total mass of the liquid chemical. A content of water in the liquid chemical refers to a content of water measured using a device based on a Karl Fischer moisture measurement method as measurement principle.

<Resin>

The liquid chemical may further include a resin. As the resin, a resin P having a group that is decomposed by the action of an acid to generate a polar group is preferable. As the resin, a resin, which has a repeating unit represented by Formula (AI) and which is a resin in which solubility in a developer containing an organic solvent as a main component is reduced by the action of an acid, is more preferable. The resin having a repeating unit represented by Formula (AI) has a group that is decomposed by the action of an acid to generate an alkali-soluble group (hereinafter, also referred to as an "acid-decomposable group").

Examples of polar groups include an alkali-soluble group. Examples of alkali-soluble groups include a carboxy group, a fluorinated alcohol group (preferably a hexafluoroisopropanol group), a phenolic hydroxyl group, and a sulfo group.

A polar group in the acid-decomposable group is protected by a leaving group assisted by an acid (acid leaving group). Examples of acid leaving groups include —C($R_{36}$)($R_{37}$)($R_{38}$), —C($R_{36}$)($R_{37}$)(O$R_{39}$), and —C($R_{01}$)($R_{02}$)(O$R_{39}$), and the like.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P in which solubility in a developer containing an organic solvent as a main component is reduced by the action of an acid will be described in detail.
(Formula (AI): Repeating Unit Having Acid-Decomposable Group)

The resin P preferably contains a repeating unit represented by Formula (AI).

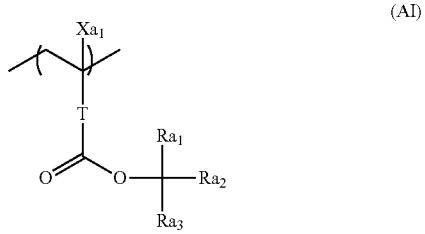

(AI)

In Formula (AI), $Xa_1$ represents a hydrogen atom, or an alkyl group which may have a substituent;

T represents a single bond or a divalent linking group; and $Ra_1$ to $Ra_3$ each independently represent a (linear or branched) alkyl group or a (monocyclic or polycyclic) cycloalkyl group, where two of $Ra_1$ to $Ra_3$ may be bonded to each other to form a (monocyclic or polycyclic) cycloalkyl group.

Examples of alkyl groups which may have a substituent and is represented by $Xa_1$ include a methyl group and a group represented by —$CH_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of divalent linking groups for T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms and is more preferably a —$CH_2$— group, a —$(CH_2)_2$— group, or a —$(CH_2)_3$— group.

An alkyl group for $Ra_1$ to $Ra_3$ preferably has 1 to 4 carbon atoms.

As a cycloalkyl group for $Ra_1$ to $Ra_3$, monocyclic cycloalkyl groups such as a cyclopentyl group or a cyclohexyl group; or polycyclic cycloalkyl groups such as a norbornyl group, a tetracyclodecanyl group, a tetracyclododecanyl group, or an adamantyl group are preferable.

As a cycloalkyl group formed by bonding of two of $Ra_1$ to $Ra_3$ to each other, monocyclic cycloalkyl groups such as a cyclopentyl group or a cyclohexyl group; or polycyclic cycloalkyl groups such as a norbornyl group, a tetracyclodecanyl group, a tetracyclododecanyl group, or an adamantyl group are preferable. A monocyclic cycloalkyl group having 5 to 6 carbon atoms is more preferable.

In the above-mentioned cycloalkyl group formed by bonding of two of $Ra_1$ to $Ra_3$ to each other, for example, one of methylene groups constituting a ring may be substituted by a hetero atom such as an oxygen atom, or by a group having a hetero atom such as a carbonyl group.

In the repeating unit represented by Formula (AI), for example, an aspect is preferable, in which $Ra_1$ is a methyl group or an ethyl group, and $Ra_2$ and $Ra_3$ are boned to each other to form the above-described cycloalkyl group.

Each of the above groups may have a substituent. Examples of substituents include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like, where the number of carbon atoms is preferably 8 or less.

A content of the repeating unit represented by Formula (AI) is preferably 20 to 90 mol %, more preferably 25 to 85 mol %, and even more preferably 30 to 80 mol % with respect to all repeating units in the resin P.
(Repeating Unit Having Lactone Structure)

In addition, the resin P preferably contains a repeating unit Q having a lactone structure.

The repeating unit Q having a lactone structure preferably has a lactone structure in a side chain, and it is more preferably a repeating unit derived from a (meth)acrylic acid derivative monomer.

As the repeating unit Q having a lactone structure, one kind thereof may be used alone, or two or more kinds thereof may be used in combination, but it is preferable to use one kind alone.

A content of the repeating unit Q having a lactone structure is preferably 3 to 80 mol % and more preferably 3 to 60 mol % with respect to all repeating units in the resin P.

The lactone structure is preferably a 5- to 7-membered lactone structure, and is more preferably a structure in which another ring structure is condensed with a 5- to 7-membered lactone structure to form a bicyclo structure or a Spiro structure.

The lactone structure preferably has a repeating unit having a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and is more preferably a lactone structure represented by Formula (LC1-4).

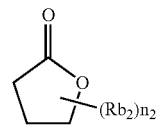

LC1-1

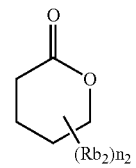

LC1-2

-continued

LC1-3 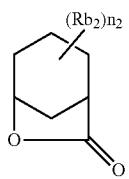

LC1-4 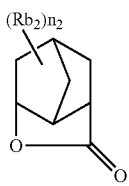

LC1-5 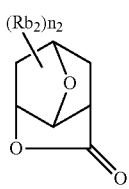

LC1-6 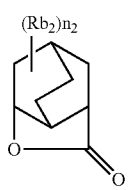

LC1-7 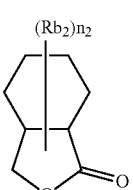

LC1-8 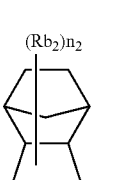

LC1-9 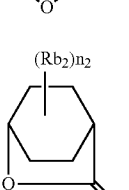

LC1-10 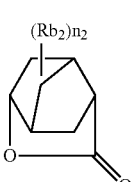

-continued

LC1-11 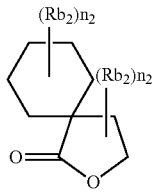

LC1-12 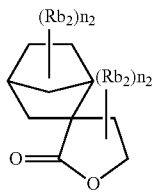

LC1-13 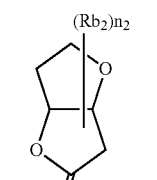

LC1-14 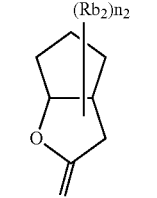

LC1-15 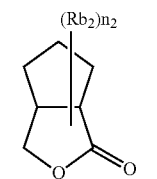

LC1-16 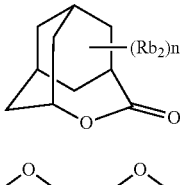

LC1-17 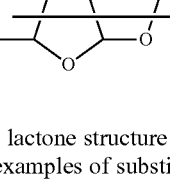

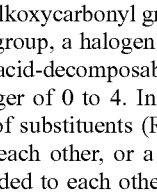

A portion of the lactone structure may have a substituent ($Rb_2$). Preferable examples of substituents ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like. $n_2$ represents an integer of 0 to 4. In a case where $n_2$ is 2 or more, a plurality of substituents ($Rb_2$) may be the same as or different from each other, or a plurality of substituents ($Rb_2$) may be bonded to each other to form a ring.

(Repeating Unit Having Phenolic Hydroxyl Group)

The resin P may contain a repeating unit having a phenolic hydroxyl group.

Examples of repeating units having a phenolic hydroxyl group include a repeating unit represented by General Formula (I).

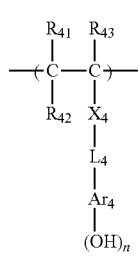

In the formula, $R_{41}$, $R_{42}$, and $R_{43}$ each independently represent a hydrogen atom, an alkyl group, a halogen atom, a cyano group, or an alkoxycarbonyl group, where $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As an alkyl group for $R_{41}$, $R_{42}$, and $R_{43}$ in General Formula (I), an alkyl group having 20 or less carbon atoms is preferable, an alkyl group having 8 or less carbon atoms is more preferable, and an alkyl group having 3 or less carbon atoms is even more preferable, where alkyl groups may have a substituent, and examples of alkyl groups include a methyl group, an ethyl group, a propyl group, an isopropyl group, an n-butyl group, a sec-butyl group, a hexyl group, a 2-ethylhexyl group, an octyl group, a dodecyl group, and the like.

A cycloalkyl group for $R_{41}$, $R_{42}$, and $R_{43}$ in General Formula (I) may be a monocyclic type or a polycyclic type. The cycloalkyl group is preferably a monocyclic cycloalkyl group such as a cyclopropyl group, a cyclopentyl group, and a cyclohexyl group, where the cycloalkyl group has 3 to 8 carbon atoms and may have a substituent.

Examples of halogen atoms for $R_{41}$, $R_{42}$, and $R_{43}$ in General Formula (I) include a fluorine atom, a chlorine atom, a bromine atom, and an iodine atom, where a fluorine atom is preferable.

As an alkyl group contained in an alkoxycarbonyl group for $R_{41}$, $R_{42}$, and $R_{43}$ in General Formula (I), the same as those described for the above-described alkyl group in $R_{41}$, $R_{42}$, and $R_{43}$ are preferable.

Examples of substituents in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like, where the substituent preferably has 8 or less carbon atoms.

$Ar_4$ represents an (n+1)-valent aromatic ring group. Examples of divalent aromatic ring groups in a case where n is 1 include arylene groups such as a phenylene group, a tolylene group, a naphthylene group, and an anthracenylene group, where an arylene group has 6 to 18 carbon atoms and may have a substituent; and aromatic ring groups including a heterocyclic ring such as thiophene, furan, pyrrole, benzothiophene, benzofuran, benzopyrrole, triazine, imidazole, benzimidazole, triazole, thiadiazole, and thiazole.

Specific examples of (n+1)-valent aromatic ring groups in a case where n is an integer of 2 or more include groups in which (n−1) arbitrary hydrogen atoms have been removed from the above-described specific examples of the divalent aromatic ring groups.

The (n+1)-valent aromatic ring group may further have a substituent.

Examples of substituents that may be included in the above-mentioned alkyl group, cycloalkyl group, alkoxycarbonyl group, alkylene group, and (n+1)-valent aromatic ring group include alkyl groups exemplified for $R_{41}$, $R_{42}$, and $R_{43}$ in General Formula (I); alkoxy groups such as a methoxy group, an ethoxy group, a hydroxyethoxy group, a propoxy group, a hydroxypropoxy group, and a butoxy group; and aryl groups such as a phenyl group.

As an alkyl group for $R_{64}$ in —CONR$_{64}$— (where $R_{64}$ represents a hydrogen atom or an alkyl group) represented by $X_4$, an alkyl group having 20 or less carbon atoms is preferable, and an alkyl group having 8 or less carbon atoms is more preferable, where alkyl groups may have a substituent, and examples of alkyl groups include a methyl group, an ethyl group, a propyl group, an isopropyl group, an n-butyl group, a sec-butyl group, a hexyl group, a 2-ethylhexyl group, an octyl group, a dodecyl group, and the like.

$X_4$ is preferably a single bond, —COO—, or —CONH—, and is more preferably a single bond or —COO—.

An alkylene group for $L_4$ is preferably an alkylene group such as a methylene group, an ethylene group, a propylene group, a butylene group, a hexylene group, and an octylene group, where an alkylene group has 1 to 8 carbon atoms and may have a substituent.

$Ar_4$ is preferably an aromatic ring group which has 6 to 18 carbon atoms and may have a substituent, and is more preferably a benzene ring group, a naphthalene ring group, or a biphenylene ring group.

The repeating unit represented by General Formula (I) preferably has a hydroxystyrene structure. That is, $Ar_4$ is preferably a benzene ring group.

A content of the repeating unit having a phenolic hydroxyl group is preferably 0 to 50 mol %, more preferably 0 to 45 mol %, and even more preferably 0 to 40 mol % with respect to all repeating units in the resin P.

(Repeating Unit Containing Organic Group Having Polar Group)

The resin P may further contain a repeating unit containing an organic group having a polar group, in particular, a repeating unit having an alicyclic hydrocarbon structure substituted by a polar group. Thereby, adhesiveness to substrates and affinity for developers are improved.

The alicyclic hydrocarbon structure substituted by a polar group is preferably an adamantyl group, a diamantyl group, or a norbornane group. The polar group is preferably a hydroxyl group or a cyano group.

In a case where the resin P contains the repeating unit containing an organic group having a polar group, a content thereof is preferably 1 to 50 mol %, more preferably 1 to 30 mol %, even more preferably 5 to 25 mol %, and particularly preferably 5 to 20 mol % with respect to all repeating units in the resin P.

(Repeating Unit Represented by General Formula (VI))

The resin P may contain a repeating unit represented by General Formula (VI).

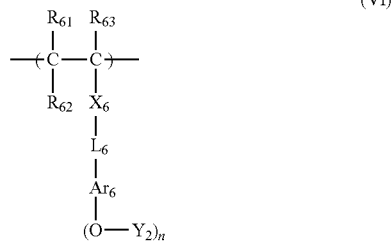

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group, where $R_{62}$ may be bonded to $Ar_6$ to form a ring, and in this case, $R_{62}$ represents a single bond or an alkylene group;

$X_6$ represents a single bond, —COO—, or —$CONR_{64}$—; $R_{64}$ represents a hydrogen atom or an alkyl group;

$L_6$ represents a single bond or an alkylene group;

$Ar_6$ represents a (n+1)-valent aromatic ring group, and in a case where $Ar_6$ is bonded to $R_{62}$ to form a ring, $Ar_6$ represents an (n+2)-valent aromatic ring group;

$Y_2$'s each independently represent a hydrogen atom, or a leaving group assisted by the action of an acid in a case where n≥2, where at least one of $Y_2$'s represents a leaving group assisted by the action of an acid; and n represents an integer of 1 to 4.

As a leaving group $Y_2$ assisted by the action of an acid, a structure represented by General Formula (VI-A) is preferable.

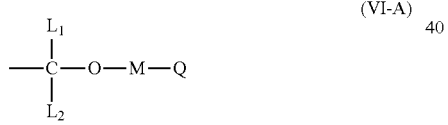

$L_1$ and $L_2$ each independently represent a hydrogen atom, an alkyl group, a cycloalkyl group, an aryl group, or a group in which an alkylene group and an aryl group are combined.

M represents a single bond or a divalent linking group.

Q represents an alkyl group, a cycloalkyl group which may contain a hetero atom, an aryl group which may contain a hetero atom, an amino group, an ammonium group, a mercapto group, a cyano group, or an aldehyde group.

At least two of Q, M, or $L_1$ may be bonded to each other to form a ring (preferably a 5- or 6-membered ring).

The repeating unit represented by General Formula (VI) is preferably a repeating unit represented by General Formula (3).

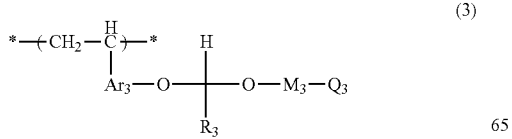

In General Formula (3), $Ar_3$ represents an aromatic ring group;

$R_3$ represents a hydrogen atom, an alkyl group, a cycloalkyl group, an aryl group, an aralkyl group, an alkoxy group, an acyl group, or a heterocyclic group;

$M_3$ represents a single bond or a divalent linking group; and $Q_3$ represents an alkyl group, a cycloalkyl group, an aryl group, or a heterocyclic group, where at least two of $Q_3$, $M_3$, or $R_3$ may be bonded to each other to form a ring.

The aromatic ring group represented by $Ar_3$ is the same as $Ar_6$ in General Formula (VI) in a case where n in General Formula (VI) is 1, and the aromatic ring group is preferably a phenylene group or a naphthylene group, and is more preferably a phenylene group.

(Repeating Unit Having Silicon Atom in Side Chain)

The resin P may further contain a repeating unit having a silicon atom in a side chain. Examples of repeating units having a silicon atom in a side chain include a (meth)acrylate-based repeating unit having a silicon atom, a vinyl-based repeating unit having a silicon atom, and the like. The repeating unit having a silicon atom in and side chain is typically a repeating unit having a group having a silicon atom in a side chain. Examples of groups having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, and a dimethyltrimethylsiloxysilyl group; cyclic or linear polysiloxanes, or a cage-type, ladder-type, or random-type silsesquioxane structures which are shown below; and the like. In the formula, R and $R^1$ each independently represent a monovalent substituent. The symbol "*" represents a bond.

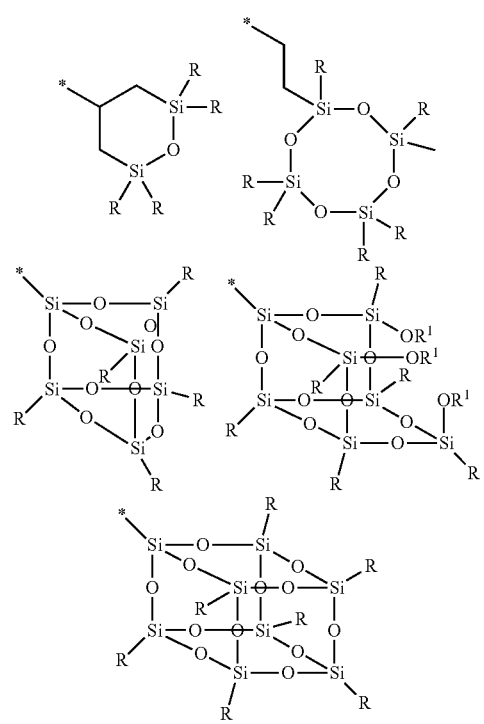

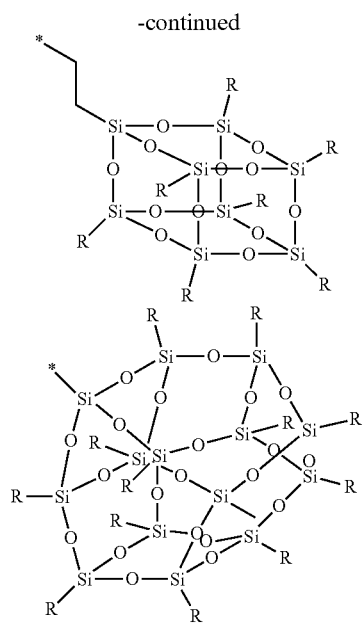

The repeating unit having the above group is preferably, for example, a repeating unit derived from an acrylate compound or a methacrylate compound which has the above group, or a repeating unit derived from a compound having the above group and a vinyl group.

In a case where the resin P has the repeating unit having a silicon atom in a side chain, a content thereof is preferably 1 to 30 mol %, more preferably 5 to 25 mol %, and even more preferably 5 to 20 mol % with respect to all repeating units in the resin P.

A weight-average molecular weight of the resin P is preferably 1,000 to 200,000, more preferably 3,000 to 20,000, and even more preferably 5,000 to 15,000 as a polystyrene equivalent value by gel permeation chromatography (GPC). In a case where a weight-average molecular weight is 1,000 to 200,000, it is possible to prevent a deterioration of heat resistance and dry etching resistance, and to prevent a deterioration of developability, and a deterioration of film formability due to increased viscosity.

A dispersity (molecular weight distribution) is generally 1 to 5, is preferably 1 to 3, is more preferably 1.2 to 3.0, and is even more preferably 1.2 to 2.0.

In the liquid chemical, a content of the resin P is preferably 50% to 99.9% by mass and more preferably 60% to 99.0% by mass with respect to a total solid content.

In addition, in the liquid chemical, as the resin P, one kind thereof may be used alone, or plural kinds thereof may be used in combination.

As other components (for example, acid-generating agents, basic compounds, quenchers, hydrophobic resins, surfactants, solvents, and the like) contained in the liquid chemical, any known components can be used. Examples of other components include components contained in an actinic ray-sensitive or radiation-sensitive resin composition disclosed in JP2013-195844A, JP2016-057645A, JP2015-207006A, WO2014/148241A, JP2016-188385A, JP2017-219818A, and the like.

[Use Applications of Liquid Chemical]

The liquid chemical according to the above embodiment is preferably used for manufacturing a semiconductor device. In particular, it is more preferably used for forming a fine pattern with a node of 10 nm or less (for example, a step including pattern formation using EUV).

The liquid chemical according to the above embodiment is more preferably used as a liquid chemical (a pre-wetting solution, a developer, a rinsing solution, a solvent for resist solution, a peeling solution, and the like) which is used in a process for a resist in which a pattern width and/or a pattern space is 17 nm or less (preferably 15 nm or less and more preferably 12 nm or less), and/or a wiring width to be obtained and/or a wiring space to be obtained is 17 nm or less. In other words, the liquid chemical according to the above embodiment is more preferably used as a liquid chemical for manufacturing a semiconductor device that is manufactured using a resist film in which a pattern width and/or a pattern space is 17 nm or less.

Specifically, the liquid chemical is used for treating an organic substance in a step of manufacturing a semiconductor device, including a lithography step, an etching step, an ion implantation step, a peeling step, and the like after completing the respective steps or before proceeding to the next step. Specifically, the liquid chemical is suitably used as a resist solution, a pre-wetting solution, a developer, a rinsing solution, a peeling solution, and the like. For example, the liquid chemical can be used for rinsing an edge line of a semiconductor substrate before and after resist application.

In addition, the liquid chemical can be used as a dilute solution of a resin contained in a resist solution, and a solvent contained in a resist solution. Furthermore, the liquid chemical may be diluted with other organic solvents and/or water and the like.

Furthermore, the liquid chemical can be used for other use applications other than manufacture of semiconductor devices, and can also be used as a developer for polyimide, a resist for sensors, a resist for lenses; a rinsing solution; and the like.

Furthermore, the liquid chemical can be used as a solvent for medical use applications or cleaning use applications. In particular, the liquid chemical can be suitably used for cleaning containers, piping, substrates (such as wafers and glass), and the like.

Among the above examples, the present liquid chemical exhibits more excellent effects in a case of being adopted as a pre-wetting solution, a developer, and a rinsing solution in pattern formation using extreme ultraviolet (EUV).

[Method for Producing Liquid Chemical]

A method for producing the above-described liquid chemical is not particularly limited, and known production methods can be used. Among the methods, a method for producing a liquid chemical preferably includes a filtration step of filtering a purification target substance containing an organic solvent using a filter to obtain a liquid chemical from the viewpoint that then, a liquid chemical exhibiting more excellent effects of the present invention is obtained.

The purification target substance used in the filtration step is obtained by purchasing or the like, and by reacting raw materials. As the purification target substance, it is preferable to use the above-described substance in which a content of particles and/or impurities is small. Examples of commercially available products of such purification target substance include a product called "high-purity grade product."

A method of obtaining a purification target substance (typically, a purification target substance containing an organic solvent) by reacting raw materials is not particularly limited, and known methods can be used. For example, there is a method in which one or plural raw materials are reacted in the presence of a catalyst to obtain an organic solvent.

More specific examples thereof include a method of reacting acetic acid and n-butanol in the presence of sulfuric acid to obtain butyl acetate; a method of reacting ethylene, oxygen, and water in the presence of Al $(C_2H_5)_3$ to obtain 1-hexanol; a method of reacting cis-4-methyl-2-pentene in the presence of Ipc2BH (Diisopinocampheylborane) to obtain 4-methyl-2-pentanol; a method of reacting propylene oxide, methanol, and acetic acid in the presence of sulfuric acid to obtain PGMEA (propylene glycol 1-monomethyl ether 2-acetate); a method of reacting acetone and hydrogen in the presence of copper oxide-zinc oxide-aluminum oxide to obtain IPA (isopropyl alcohol); a method of reacting lactic acid and ethanol to obtain ethyl lactate; and the like.

<Filtration Step>

The method for producing a liquid chemical according to the embodiment of the present invention includes a filtration step of filtering the above-mentioned purification target substance using a filter to obtain a liquid chemical. A method of filtering the purification target substance using a filter is not particularly limited, and it is preferable that the purification target substance be passed through (allowing a liquid to be passed through) a filter unit having a housing and a cartridge filter housed in the housing under pressurization or non-pressurization.

Pore Diameter of Filter

A pore diameter of the filter is not particularly limited, and it is possible to use filters having a pore diameter which are generally used for filtering a purification target substance. Among the filters, a pore diameter of the filter is preferably 200 nm or smaller, more preferably 20 nm or smaller, even more preferably 10 nm or smaller, particularly preferably 5 nm or smaller, and most preferably 3 nm or smaller, from the viewpoint that then, it is possible to easily control the number of particles contained in the liquid chemical which have a particle size of 0.5 to 17 nm within a desired range. The lower limit value is not particularly limited, but in general, it is preferably 1 nm or larger from the viewpoint of productivity.

In the present specification, a pore diameter and pore diameter distribution of the filter respectively refer to a pore diameter and pore diameter distribution determined by a bubble point of isopropanol (IPA) or HFE-7200 ("Novec 7200," manufactured by 3M, hydrofluoroether, $C_4F_9OC_2H_5$).

In a case where a pore diameter of the filter is 5.0 nm or smaller, this is preferable from the viewpoint that then, it is possible to easily control the number of particles contained in the liquid chemical which have a particle size of 0.5 to 17 nm. Hereinafter, a filter having a pore diameter of 5 nm or smaller is also referred to as a "micropore diameter filter."

The micropore diameter filter may be used alone or in combination with a filter having a different pore diameter. Among filters, it is preferable to use a filter having a larger pore diameter in combination from the viewpoint of more excellent productivity. In this case, a liquid of a purification target substance, which has been filtered through a filter having a larger pore diameter in advance, is passed through the micropore diameter filter, whereby clogging of the micropore diameter filter can be prevented.

That is, as a pore diameter of the filter, in a case of using one filter, a pore diameter of the filter is preferably 5.0 nm or smaller, and in a case of using two or more filters, the smallest pore diameter among pore diameters of the filters is preferably 5.0 nm or smaller.

An aspect in which two or more kinds of filters having different pore diameters are sequentially used is not particularly limited, and examples thereof include a method of sequentially disposing the above-described filter units along a pipe line through which a purification target substance is transferred. At this case, in a case where a flow rate of a purification target substance per unit time is made constant in the entire pipe line, in some cases, a larger pressure is applied to a filter unit having a smaller pore diameter as compared with a filter unit having a larger pore diameter. In this case, it is preferable to increase a filtration area by disposing a pressure adjustment valve, a damper, and the like between filter units, and thereby making a pressure applied to a filter unit having a small pore diameter constant, or by disposing the filter units in which the same filter is housed in parallel along the pipe line. Accordingly, it is possible to more stably control the number of particles of 0.5 to 17 nm contained in the liquid chemical.

Material of Filter

A material of the filter is not particularly limited, and known materials for the filter can be used. Specific examples thereof in a case where a resin is used include polyamides such as 6-nylon and 6,6-nylon; polyolefins such as polyethylene and polypropylene; polystyrene; polyimide; polyamide imide; poly(meth)acrylate; polyfluorocarbons such as polytetrafluoroethylene, perfluoroalkoxyalkane, perfluoroethylene propene copolymer, ethylene-tetrafluoroethylene copolymer, ethylene-chlorotrifluoro ethylene copolymer, polychlorotrifluoroethylene, polyvinylidene fluoride, and polyvinyl fluoride; polyvinyl alcohols; polyesters; celluloses; cellulose acetates; and the like. Among the examples, at least one selected from the group consisting of nylon (among which 6,6-nylon is preferable), polyolefins (among which polyethylene is preferable), poly(meth)acrylates, and polyfluorocarbons (among which polytetrafluoroethylene (PTFE) and perfluoroalkoxyalkane (PFA) are preferable) is preferable from the viewpoint that then, a filter has more excellent solvent resistance, and a liquid chemical to be obtained exhibits more excellent defect inhibitive performance. As these polymers, one kind thereof can be used alone or two or more kinds thereof can be used in combination.

Furthermore, in addition to the resin, diatomaceous earth, glass, and the like may be used.

In addition, the filter may be surface-treated. A method of surface treatment is not particularly limited, and known methods can be used. Examples of a method of surface treatment include a chemical modification treatment, a plasma treatment, a hydrophobic treatment, coating, a gas treatment, sintering, and the like.

A plasma treatment is preferable because then a surface of the filter is hydrophilized. A water contact angle on a surface of the filter that has been hydrophilized by a plasma treatment is not particularly limited, but a static contact angle at 25° C. measured by a contact angle meter is preferably 60° or less, more preferably 50° or less, and even more preferably 30° or less.

As a chemical modification treatment, a method of introducing an ion exchange group into a base material of the filter is preferable.

That is, as the filter, a filter in which each of the above-described materials is used as a base material and an ion exchange group is introduced into the base material is preferable. Typically, a filter including a base material having an ion exchange group on a surface of the base material is preferable. A surface-modified base material is not particularly limited, and a base material in which an ion exchange group is introduced into the above-mentioned polymer is preferable from the viewpoint that then, production becomes easier.

Regarding an ion exchange group, examples of cation exchange groups include a sulfonic acid group, a carboxy group, a phosphoric acid group, and the like, and examples of anion exchange groups include a quaternary ammonium group and the like. A method of introducing an ion exchange group into a polymer is not particularly limited, and examples thereof include a method of reacting a compound having an ion exchange group and a polymerizable group with a polymer for typically grafting.

A method of introducing an ion exchange group is not particularly limited, but fibers of the above-mentioned resin are irradiated with ionizing radiation (such as α-rays, β-rays, γ-rays, X-rays, electron rays, and the like) to generate active portions (radicals) in the resin. This irradiated resin is immersed in a monomer-containing solution to graft-polymerize the monomer onto a base material. As a result, a polymer in which this monomer is bonded to polyolefin fibers as a graft-polymerized side chain is generated. By contacting and reacting a resin having this generated polymer as a side chain with a compound having an anion exchange group or a cation exchange group, an ion exchange group is introduced into the polymer of the graft-polymerized side chain, and thereby a final product is obtained.

In addition, the filter may have a configuration in which a woven or a non-woven fabric in which an ion exchange group is formed by a radiation graft polymerization method is combined with a glass wool, a woven, or a non-woven fabric of the related art.

In a case where a filter having an ion exchange group is used, it is easy to control a content of particles containing a metal atom in the liquid chemical within a desired range. A material of the filter having an ion exchange group is not particularly limited, and examples thereof include a material in which an ion exchange group has been introduced into polyfluorocarbon or polyolefin, and a material in which an ion exchange group has been introduced into polyfluorocarbon is more preferable.

A pore diameter of the filter having an ion exchange group is not particularly limited, but it is preferably 1 to 30 nm and more preferably 5 to 20 nm. The filter having an ion exchange group may also serve as the above-mentioned filter having the smallest pore diameter, or may be used separately from the filter having the smallest pore diameter. Among the examples, as the filtration step, an aspect is preferable in which a filter having an ion exchange group is used in combination with a filter not having an ion exchange group and having the smallest pore diameter, from the viewpoint that then, it is possible to obtain a liquid chemical exhibiting more excellent effects of the present invention.

A material of the above-described filter having the smallest pore diameter is not particularly limited, but in general, at least one selected from the group consisting of polyfluorocarbons and polyolefins is preferable, and polyolefin is more preferable from the viewpoint of solvent resistance and the like.

In addition, in a case where a material of the filter is polyamide (particularly, nylon), it is possible to more easily control a content of a high-boiling point organic compound and the particles U in the liquid chemical, and in particular, it is possible to further more easily control a content of the particles U in the liquid chemical.

Accordingly, as the filter used in the filtration step, it is preferable to use two or more kinds of filters of different materials, and it is more preferable to use two or more kinds thereof selected from the group consisting of polyolefins, polyfluorocarbons, polyamides, and a base material in which an ion exchange group has been introduced in these materials.

Pore Structure of Filter

A pore structure of the filter is not particularly limited, and it may be appropriately selected according to components in a purification target substance. In the present specification, a pore structure of a filter means pore diameter distribution, positional distribution of pores in a filter, a shape of pores, and the like, and it can be typically controlled by a method for manufacturing a filter.

For example, in a case where a filter is formed by sintering a powder of a resin or the like, a porous film can be obtained, and in a case where a filter is formed by a method such as electrospinning, electroblowing, and melt-blowing, a fiber film can be obtained. These filters respectively have different pore structures.

A "porous film" refers to a film allowing components in a purification target substance such as gels, particles, colloids, cells, and oligomers to be retained, and allowing components that are substantially smaller than pores to be passed through the pores. The retention of components in a purification target substance by the porous film may depend in operating conditions such as a surface velocity, use of surfactants, a pH, and a combination thereof, and may depend on a pore diameter and structure of the porous film, and a size and structure (whether particles are hard particles, gels, or the like) of particles to be removed.

In a case where a purification target substance contains the particles U (which may be in a gel form) as impurities, particles containing a high-boiling point organic compound are negatively charged in many cases, and a filter made of polyamide performs a function of a non-sieve film for removing such particles. Typical examples of non-sieve films include nylon films such as nylon-6 films and nylon-6,6 films, but examples are not limited thereto.

The "non-sieving" retention mechanism referred to in the present specification refers to retention by mechanisms, such as obstruction, diffusion, and adsorption, which are not related to filter pressure drop or pore diameters.

The non-sieving retention includes retention mechanisms, such as obstruction, diffusion, and adsorption, which remove removal target particles from a purification target substance, and which are not related to filter pressure drop or filter pore diameters. The adsorption of particles on a filter surface can be mediated by, for example, intermolecular Van der Waals forces, electrostatic forces, or the like. An obstructive effect occurs in a case where particles traveling in a non-sieving film layer having a tortuous path cannot change their direction quickly enough to avoid coming into contact with the non-sieving film. Particle transport by diffusion mainly occurs from random motion or Brownian motion of small particles, which creates a certain probability that the particles will collide with a filtration material. The non-sieving retention mechanism becomes active in a case where no repulsion force is present between particles and a filter.

Ultra high molecular weight polyethylene (UPE) filters are typically sieve films. A sieve film refers to a film that mainly captures particles by a sieving retention mechanism, or a film that is optimized for capturing particles by a sieving retention mechanism.

Typical examples of sieve films include polytetrafluoroethylene (PTFE) films and UPE films, but examples are not limited thereto.

The "sieving retention mechanism" refers to retention resulted due to removal target particles being larger than a pore diameter of a porous film. A sieving retention force can be improved by formation of a filter cake (aggregation of removal target particles on a film surface). The filter cake effectively performs a function of a secondary filter.

A material of a fiber layer is not particularly limited as long as it is a polymer from which a fiber layer can be formed. Examples of polymers include polyamide and the like. Examples of polyamides include nylon 6, nylon 6,6, and the like. The polymer for forming a fiber film may be poly(ethersulfone). In a case where a fiber film is on a primary side of a porous film, surface energy of the fiber film is preferably higher than that of a polymer that is a material of the porous film and is on a secondary side. Examples of such combinations include a case in which a material of the fiber film is nylon and a porous film is polyethylene (UPE).

A method for producing a fiber film is not particularly limited, and knowns method can be used. Examples of methods for producing a fiber film include electrospinning, electroblowing, melt-blowing, and the like.

A pore structure of a porous film (for example, porous films including UPE, PTFE, and the like) is not particularly limited, and examples of pore shapes include a lace shape, a string shape, a node shape, and the like.

Pore diameter distribution in a porous film and position distribution in the film are not particularly limited. The size distribution may be smaller and the position distribution in the film may be symmetric. Alternatively, the size distribution may be larger and the position distribution in the film may be asymmetric (the above film is also referred to as an "asymmetric porous film"). In the asymmetric porous film, a size of pores varies throughout the film, and typically, a pore diameter increases from one surface of the film toward the other surface of the film. In this case, a surface on a side with many pores having a large pore diameter is referred to as an "open side", and a surface on a side with many pores with a small pore diameter is referred to as a "tight side."

In addition, examples of asymmetric porous films include a film (which is also referred to as a "hourglass shape") in which a size of pores is a minimum at a certain position in a thickness of the film.

In a case where an asymmetric porous film is used and pores having a larger size are on a primary side, in other words, in a case where a primary side is an open side, a pre-filtration effect can be produced.

The porous film may contain thermoplastic polymers such as PESU (polyethersulfone), PFA (perfluoroalkoxyalkane, a copolymer of ethylene tetrafluoride and perfluoroalkoxyalkane), polyamide, and polyolefin, or may contain polytetrafluoroethylene and the like.

Among the examples, an ultra high molecular weight polyethylene is preferable as a material of the porous film. An ultra high molecular weight polyethylene refers to a thermoplastic polyethylene having an extremely long chain, and preferably has a molecular weight of 1,000,000 or more, typically 2,000,000 to 6,000,000.

As the filter used in the filtration step, it is preferable to use two or more kinds of filters having different pore structures, and it is more preferable to use a filter of a porous film and a fiber film. Specifically, it is preferable to use a filter of a nylon fiber film and a filter of a UPE porous film in combination.

As described above, the filtration step according to the embodiment of the present invention is preferably a multi-stage filtration step in which a purification target substance is passed through two or more kinds of filters different in at least one selected from the group consisting of a filter material, a pore diameter, and a pore structure.

(Multi-Stage Filtration Step)

The multi-stage filtration step can be performed using known purification devices. FIG. 1 is a schematic diagram showing a typical example of a purification device with which the multi-stage filtration step can be performed. A purification device 10 includes a production tank 11, a filtration device 16, and a filling device 13, and the respective units are connected by a pipe line 14.

The filtration device 16 has filter units 12(*a*) and 12(*b*) connected by the pipe line 14. An adjustment valve 15(*a*) is disposed in the pipe line between the filter units 12(*a*) and 12(*b*).

FIG. 1 shows a case in which the number of filter units is two, but three or more filter units may be used.

In FIG. 1, a purification target substance is stored in the production tank 11. Next, a pump (not shown) disposed in the pipe line 14 is operated, and the purification target substance is sent from the production tank 11 to the filtration device 16 via the pipe line 14. A direction in which the purification target substance is transferred in the purification device 10 is indicated by $F_1$ in FIG. 1.

The filtration device 16 consists of the filter units 12(*a*) and 12(*b*) connected by the pipe line 14. In each of the two filter units, a cartridge filter, which has filters different in at least one selected from the group consisting of a pore diameter, a material, and a pore structure, is housed. The filtration device 16 has a function of filtering a purification target substance supplied through a pipe line by a filter.

The filter housed in the respective filter units is not particularly limited, but a filter having the smallest pore diameter is preferably housed in the filter unit 12(*b*).

By operating the pump, the purification target substance is supplied to the filter unit 12(*a*) to be filtered. The purification target substance filtered by the filter unit 12(*a*) is reduced in pressure as needed by the adjustment valve 15(*a*), and supplied to the filter unit 12(*b*) to be filtered.

The purification device may not include the adjustment valve 15(*a*). In addition, even in a case where the purification device includes the adjustment valve 15(*a*), a position thereof may be on a primary side of the filter unit 12(*a*).

Furthermore, as a device capable of adjusting a supply pressure for a purification target substance, a device other than the adjustment valve may be used. Examples of such a member include a damper and the like.

In addition, in the filtration device 16, each filter forms a cartridge filter, but a filter that can be used in the purification method according to the present embodiment is not limited to the above-described embodiment. For example, an aspect in which a purification target substance is passed through a filter formed in a flat plate shape may be employed.

Furthermore, a configuration is employed in which, in the purification device 10, a purification target substance that has been filtered by the filter unit 12(*b*) is transferred to the filling device 13 and accommodated in a container. However, the filtration device for performing the above-described purification method is not limited to the above configuration, and a configuration may be employed in which a purification target substance that has been filtered by the filter unit 12(*b*) is returned to the production tank 11, and a liquid thereof is again passed through the filter unit 12(*a*) and the filter unit 12(*b*). The above-mentioned filtration method is called circulation filtration. In purification of a purification target substance by the circulation filtration, at least one of two or more kinds of filters is used twice or more. In the present specification, an operation of returning a filtered purification target substance, which has been filtered by the respective filter units, again to the production tank is counted as one circulation. The number of circulations may be appropriately selected according to components in a purification target substance, and the like.

A material of a liquid-contacting part (referring to an inner wall surface or the like with which a purification target substance and the liquid chemical may come into contact) of the above-mentioned purification device is not particularly limited, but the liquid-contacting part is preferably formed of at least one kind (hereinafter, also collectively referred to as a "corrosion-resistant material") selected from the group consisting of a non-metallic material and an electrolytically polished metallic material. For example, in a case where the liquid-contacting part of the production tank is formed of a corrosion-resistant material, this means there are cases in which the production tank itself consists of a corrosion-resistant material, or an inner wall or the like of the production tank is coated with a corrosion-resistant material.

The above-mentioned non-metallic material is not particularly limited, and known materials can be used.

Examples of non-metallic materials include at least one selected from the group consisting of a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a trifluorochloroethylene-ethylene copolymer resin, a fluorovinylidene resin, a trifluorochloroethylene copolymer resin, and a fluorovinyl resin, but examples are not limited thereto.

The above-mentioned metallic material is not particularly limited, and known materials can be used.

Examples of metallic materials include metallic materials in which a total content of Cr and Ni is more than 25% by mass with respect to a total mass of the metallic material, and among the metallic materials, a metallic material in which a total content of chromium and nickel is 30% by mass or more with respect to a total mass of the metallic material is more preferable. The upper limit value of a total content of Cr and Ni in the metallic material is not particularly limited, but in general, it is preferably 90% by mass or less.

Examples of metallic materials include stainless steel, a Ni—Cr alloy, and the like.

The stainless steel is not particularly limited, and known stainless steels can be used. Among the steels, an alloy containing Ni at 8% by mass or more is preferable, and an austenitic stainless steel containing Ni at 8% by mass or more is more preferable. Examples of austenitic stainless steels include SUS (Steel Use Stainless) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

The Ni—Cr alloy is not particularly limited, and known Ni—Cr alloys can be used. Among the Ni—Cr alloys, a Ni—Cr alloy having a Ni content of 40% to 75% by mass and a Cr content of 1% to 30% by mass is preferable.

Examples of Ni—Cr alloys include HASTELLOY (trade name, the same applies hereinafter), MONEL (trade name, the same applies hereinafter), INCONEL (trade name, hereinafter the same), and the like. More specific examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

In addition, the Ni—Cr alloy may further contain B, Si, W, Mo, Cu, Co, and the like if necessary, in addition to the above alloys.

A method of electrolytically polishing a metallic material is not particularly limited, and known methods can be used. For example, it is possible to use methods described in paragraphs 0011 to 0014 of JP2015-227501A, paragraphs 0036 to 0042 of JP2008-264929A, and the like.

In a case where the metallic material is electrolytically polished, it is presumed that a content of Cr in a passivation layer on a surface becomes larger than a content of Cr in a primary phase. Accordingly, in a case of using a purification device in which a liquid-contacting part is formed of a metallic material that has been electrolytically polished, it is presumed that metal impurities containing metal atoms in a purification target substance are unlikely to flow out.

The metallic material may be buff-polished. A method of buff polishing is not particularly limited, and known methods can be used. A size of abrasive grains for polishing used for buff polishing finish is not particularly limited, but it is preferably #400 or less from the viewpoint that then unevenness of a surface of the metallic material is easily reduced. The buff polishing is preferably performed before the electrolytic polishing.

<Other Steps>

The method for producing a liquid chemical according to the embodiment of the present invention is not particularly limited as long as it has the filtration step, and the method may further include steps other than the filtration step. Examples of steps other than the filtration step include a distillation step, a reaction step, a static electricity removal step, and the like.

(Distillation Step)

The distillation step is a step of distilling a purification target substance containing an organic solvent to obtain a distilled purification target substance. A method of distilling a purification target substance is not particularly limited, and known methods can be used. Typical examples thereof include a method in which a distillation column is disposed on a primary side of the above-described purification device, and a distilled purification target substance is introduced into a production tank.

In this case, a liquid-contacting part of the distillation column is not particularly limited, but it is preferably formed of the above-described corrosion-resistant material.

(Reaction Step)

The reaction step is a step of reacting raw materials to generate a purification target substance containing an organic solvent as a reactant. A method of generating a purification target substance is not particularly limited, and known methods can be used. Typical examples thereof include a method in which a reactor is disposed on a primary side of the production tank (or the distillation column) of the purification device described above, and the reactant is introduced into the production tank (or the distillation column).

In this case, a liquid-contacting part of the reactor is not particularly limited, but it is preferably formed of the above-described corrosion-resistant material.

(Static Electricity Removal Step)

The static electricity removal step is a step of reducing charge potential of the purification target substance by removing static electricity of the purification target substance.

A method of static electricity removal is not particularly limited, and known static electricity removal methods can be used. Examples of methods of static electricity removal include a method of bringing a purification target substance into contact with a conductive material.

A contact time for bringing a purification target substance into contact with a conductive material is preferably 0.001 to 60 seconds, more preferably 0.001 to 1 second, and even more preferably 0.01 to 0.1 seconds. Examples of conductive materials include stainless steel, gold, platinum, diamond, glassy carbon, and the like.

Examples of methods of bringing a purification target substance into contact with a conductive material include a method in which a grounded mesh consisting of a conductive material is disposed inside a pipe line, and a purification target substance is passed therethrough.

In purification of a purification target substance, opening of a container, cleaning of the container and the devices, accommodation of a solution, analysis, and the like, which are accompanying procedures of the purification, are all preferably performed in a clean room. The clean room is preferably a clean room having a cleanliness of 4 or higher which is specified by International Standard ISO 14644-1: 2015 specified by the International Organization for Standardization. Specifically, the clean room preferably satisfies any of ISO class 1, ISO class 2, ISO class 3, and ISO class 4; more preferably satisfies ISO class 1 or ISO class 2; and even more preferably satisfies ISO class 1.

A storage temperature for the liquid chemical is not particularly limited, but the storage temperature is preferably 4° C. or higher from the viewpoint that then, a trace amount of impurities and the like contained in the liquid chemical are less likely to be eluted, and as a result, more excellent effects of the present invention are obtained.

[Liquid-Chemical-Accommodating Body]

The liquid chemical produced by the above-described purification method may be accommodated in a container to be stored therein until used.

Such a container, and a liquid chemical (or a resist composition) accommodated in the container are collectively referred to as a liquid-chemical-accommodating body. The liquid chemical is taken out from a stored-liquid-chemical-accommodating body and used.

As a container for storing the liquid chemical, a container, in which a degree of cleanliness of an inner side is high and elution of impurities occurs less, is preferable in consideration of a use application for manufacturing semiconductor devices.

Specific examples of usable containers include "CLEAN Bottle" series manufactured by AICELLO CORPORATION, "Pure Bottle" manufactured by KODAMA PLASTICS Co., Ltd., and the like, but examples are not limited thereto.

As the container, it is preferable to use a multi-layer bottle in which a container inner wall has a six-layer structure made of six kinds of resins, or a multi-layer bottle in which a container inner wall has a seven-layer structure made of seven kinds of resins for the purpose of preventing impurities from being mixed (contamination) into the liquid chemical. Examples of these containers include a container described in JP2015-123351A.

A liquid-contacting part of this container preferably consists of the above-described corrosion-resistant material, or glass. It is preferable that 90% or more of an area of the liquid-contacting part consists of the above-mentioned material, and it is more preferable that the entire liquid-contacting part consists of the above-mentioned material from the viewpoint that then, more excellent effects of the present invention are obtained.

EXAMPLES

Hereinafter, the present invention will be described in more detail based on examples. In the following examples, materials, amounts thereof used, ratios thereof, the details of treatments, treatment procedures, and the like can be suitably modified without departing from the scope of the present invention. Accordingly, the scope of the present invention should not be limitedly interpreted by the following examples.

In preparation of liquid chemicals of examples and comparative examples, handling of containers, preparation of liquid chemicals, filling, storage, and analytical measurement were all performed in a clean room having a level satisfying ISO class 2 or 1. In measurement of contents of organic impurities, and measurement of contents of metal atoms, in a case of measuring a liquid chemical below a detection limit in normal measurement, the measurement was performed after concentrating the liquid chemical to 1/100 in terms of volume, and a content thereof was calculated by converting the concentration to a concentration of a solution before performing the concentration to improve measurement accuracy. Devices used for purification and instruments such as a filter and a container were used after their liquid-chemical-contacting surfaces were sufficiently cleaned with a liquid chemical that had been purified by the same method.

[Purification of Liquid Chemical 1]

A liquid chemical was produced by performing filtration using the same purification device as that shown in FIG. 1 except that a purification target substance (a commercial product) containing cyclohexanone (CHN) as an organic solvent was prepared, five filter units were disposed in series with respect to a pipe line, a filtration device not having an adjustment valve was used, and a pipe line, which can return a filtered purification target substance to a production tank after filtration by a filter unit at the most downstream side, was used. The following filters were disposed in the respective filter units from a primary side (in Table 1, the filters are respectively described as first to fifth filters).

Polypropylene filter (pore diameter: 200 nm, a porous film, described as "PP" in the table)

Polyfluorocarbon filter having an ion exchange group (pore diameter: 20 nm, a fiber film of a polymer of PTFE and PES (polyethylene sulfonic acid), described as "IEX" in the table)

IEX filter having a pore diameter 5 nm

Nylon filter (pore diameter: 10 nm, a fiber film, described as "Nylon" in the table)

UPE filter (pore diameter: 3 nm, a porous film, described as "UPE" in the table)

A purification target substance that had passed through the above five filter units was returned to the production tank. This operation was repeated three times, and thereby a liquid chemical was obtained.

[Purification of Liquid Chemicals 2 to 25]

Liquid chemicals 2 to 25 were obtained by purifying a purification target substance containing an organic solvent shown in Table 1 under conditions shown in Table 1. The respective liquid chemicals were obtained as follows: a liquid of a purification target substance was passed through each of the filters shown in Table 1 from the first filter to the fifth filter in order (where a liquid chemical with a blank filter column indicates that the filter was not used, for example, in the case of the liquid chemical 24, a liquid passed through the first filter to the third filter); and this operation was repeated for the number of times shown in the section of "Number of circulations."

As purification target substances shown in Table 1, purification target substances respectively having different lots were obtained. Accordingly, components other than an organic solvent initially contained in the respective purification target substances may be different in some cases.

Abbreviations in Table 1 respectively represent the following contents.

PGMEA/PGME (7:3): a mixed solution of PGMEA and PGME mixed at 7:3 (v/v)

NBA: n-butyl acetate

IAA: isoamyl acetate

MIBC: methyl isobutyl carbinol

IPA: isopropanol

PC/PGMEA (1:9): a mixed solution of PC and PGMEA mixed at 1:9 (v/v)

EL: ethyl lactate

IEX: an IEX filter having a pore diameter of 10 nm

PTFE: a polytetrafluoroethylene filter (porous film)

UPE: an ultra high molecular weight polyethylene filter (which is a porous film)

TABLE 1

| Table 1 | Purification target substance Organic solvent | First filter Material | Pore diameter (nm) | Second filter Material | Pore diameter (nm) | Third filter Material | Pore diameter (nm) | Fourth filter Material | Pore diameter (nm) | Fifth filter Material | Pore diameter (nm) | Number of circulations |
|---|---|---|---|---|---|---|---|---|---|---|---|---|
| Liquid chemical 1 | CHN | PP | 200 | IEX | 20 | IEX | 5 | Nylon | 10 | UPE | 3 | 3 |
| Liquid chemical 2 | CHN | PP | 200 | IEX | 20 | IEX | 10 | Nylon | 10 | UPE | 3 | 3 |
| Liquid chemical 3 | CHN | PP | 200 | IEX | 20 | IEX | 20 | Nylon | 10 | UPE | 3 | 3 |
| Liquid chemical 4 | CHN | PP | 200 | IEX | 20 | IEX | 20 | Nylon | 10 | UPE | 3 | 1 |
| Liquid chemical 5 | CHN | PP | 200 | IEX | 5 | IEX | 5 | Nylon | 10 | UPE | 3 | 3 |
| Liquid chemical 6 | CHN | PP | 200 | IEX | 10 | IEX | 10 | Nylon | 10 | UPE | 3 | 3 |
| Liquid chemical 7 | CHN | PP | 200 | IEX | 20 | IEX | 20 | Nylon | 10 | UPE | 5 | 3 |
| Liquid chemical 8 | CHN | PP | 200 | IEX | 5 | IEX | 5 | Nylon | 10 | UPE | 3 | 10 |
| Liquid chemical 9 | CHN | PP | 200 | IEX | 10 | IEX | 10 | Nylon | 10 | UPE | 3 | 5 |
| Liquid chemical 10 | CHN | PP | 200 | IEX | 20 | IEX | 10 | Nylon | 10 | UPE | 3 | 3 |
| Liquid chemical 11 | CHN | PP | 200 | IEX | 20 | IEX | 20 | PTFE | 20 | UPE | 3 | 3 |
| Liquid chemical 12 | CHN | PP | 200 | IEX | 20 | IEX | 20 | PTFE | 10 | UPE | 3 | 3 |
| Liquid chemical 13 | CHN | PP | 200 | IEX | 20 | IEX | 20 | PTFE | 10 | UPE | 5 | 3 |
| Liquid chemical 14 | CHN | PP | 200 | IEX | 20 | IEX | 20 | PTFE | 10 | UPE | 3 | 2 |
| Liquid chemical 15 | CHN | PP | 200 | IEX | 20 | IEX | 20 | PTFE | 10 | PTFE | 5 | 3 |
| Liquid chemical 16 | PGMEA/PGME(7:3) | PP | 200 | IEX | 20 | IEX | 5 | Nylon | 10 | UPE | 3 | 3 |
| Liquid chemical 17 | nBA | PP | 200 | IEX | 20 | IEX | 5 | Nylon | 10 | UPE | 3 | 3 |
| Liquid chemical 18 | PC/PGMEA(1:9) | PP | 200 | IEX | 20 | IEX | 5 | Nylon | 10 | UPE | 3 | 3 |
| Liquid chemical 19 | PGMEA | PP | 200 | IEX | 20 | IEX | 5 | Nylon | 10 | UPE | 3 | 3 |
| Liquid chemical 20 | EL | PP | 200 | IEX | 20 | IEX | 5 | Nylon | 10 | UPE | 3 | 3 |
| Liquid chemical 21 | iAA | PP | 200 | IEX | 20 | IEX | 5 | Nylon | 10 | UPE | 3 | 3 |
| Liquid chemical 22 | MIBC | PP | 200 | IEX | 20 | IEX | 5 | Nylon | 10 | UPE | 3 | 3 |
| Liquid chemical 23 | IPA | PP | 200 | IEX | 20 | IEX | 5 | Nylon | 10 | UPE | 3 | 3 |
| Liquid chemical 24 | CHN | PP | 200 | IEX | 10 | PTFE | 10 | | | | | 1 |
| Liquid chemical 25 | CHN | PP | 200 | IEX | 10 | IEX | 10 | IEX | 10 | | | |

Evaluation of number of particles contained which have particle size of 0.5 to 17 nm in liquid chemical A content (the number of particles contained) of particles having a particle size of 0.5 to 17 nm in the liquid chemical was measured by the following method.

First, a predetermined amount of a liquid chemical was applied on a silicon substrate to form a substrate having a liquid chemical layer, and a surface of the substrate having a liquid chemical layer was scanned with laser light to detect scattering light. Thereby, a position and a particle size of a defect present on the surface of the substrate having a liquid chemical layer were specified. Next, based on the position of the defect, elemental analysis was performed by an EDX (energy dispersive X-ray) analysis method to examine a composition of the defect. By this method, the number of Fe nanoparticles, Pb nanoparticles, Cr nanoparticles, and Ti nanoparticles on the substrate was obtained and converted into the number of particles contained per unit volume of the liquid chemical (particles/cm$^3$).

Furthermore, in the same manner, a composition of the Fe nanoparticles (a simple substance of Fe, and an oxide of a Fe atom), an association state with a high-boiling point organic compound, and the like were also identified.

For pattern analysis, a wafer inspection system "SP-5" manufactured by KLA-Tencor was used in combination with a fully automatic defect review and classification device "SEMVision G6" of Applied Materials, Inc.

A sample, for which particles having a desired particle size could not be detected due to circumstances such as a resolution capability of the measuring device, was detected using a method described in paragraphs 0015 to 0067 of JP2009-188333A. That is, an SiO$_x$ layer was formed on a substrate by a chemical vapor deposition (CVD) method, and next, a liquid chemical layer was formed to cover this layer. Next, a method was used in which a composite layer having the SiO$_x$ layer and the liquid chemical layer applied thereon was dry-etched, the obtained protruding object was irradiated with light to detect scattering light, a volume of the protruding object was calculated from the scattering light, and a particle size of the particles was calculated from the volume of the protruding object.

Table 2 shows the measurement results for the respective liquid chemicals, a ratio of the number of particles contained which was calculated based on the measurement results, and the like.

TABLE 2

| Table 2 (part 1) | Organic solvent | Configuration of metal nanoparticles | | | | | |
|---|---|---|---|---|---|---|---|
| | | Fe nanoparticles (particles/cm$^3$) | Pb nanoparticles (particles/cm$^3$) | Cr nanoparticles (particles/cm$^3$) | Ti nanoparticles (particles/cm$^3$) | Fe/Pb | Fe/Cr |
| Liquid chemical 1 | CHN | $1.2 \times 10^5$ | $9.0 \times 10^2$ | $1.5 \times 10^3$ | $3.0 \times 10^3$ | $1.3 \times 10^2$ | $8.0 \times 10^1$ |
| Liquid chemical 2 | CHN | $1.5 \times 10^5$ | $5.8 \times 10^3$ | $4.8 \times 10^3$ | $6.0 \times 10^3$ | $2.6 \times 10^1$ | $3.1 \times 10^1$ |
| Liquid chemical 3 | CHN | $1.6 \times 10^5$ | $4.6 \times 10^4$ | $2.3 \times 10^4$ | $4.1 \times 10^4$ | $3.5 \times 10^0$ | $7.0 \times 10^0$ |
| Liquid chemical 4 | CHN | $1.3 \times 10^5$ | $9.0 \times 10^4$ | $4.6 \times 10^4$ | $6.5 \times 10^4$ | $1.4 \times 10^0$ | $2.8 \times 10^6$ |
| Liquid chemical 5 | CHN | $1.5 \times 10^5$ | $6.0 \times 10^1$ | $1.4 \times 10^1$ | $1.0 \times 10^2$ | $2.5 \times 10^3$ | $1.1 \times 10^4$ |
| Liquid chemical 6 | CHN | $1.4 \times 10^5$ | $1.2 \times 10^4$ | $1.2 \times 10^4$ | $2.0 \times 10^4$ | $1.2 \times 10^1$ | $1.2 \times 10^1$ |
| Liquid chemical 7 | CHN | $1.5 \times 10^5$ | $8.0 \times 10^4$ | $1.7 \times 10^5$ | $3.5 \times 10^4$ | $1.9 \times 10^0$ | $8.7 \times 10^1$ |
| Liquid chemical 8 | CHN | $1.3 \times 10^5$ | $6.5 \times 10^1$ | $8.5 \times 10^1$ | $9.0 \times 10^0$ | $2.0 \times 10^3$ | $1.5 \times 10^3$ |
| Liquid chemical 9 | CHN | $1.9 \times 10^5$ | $8.0 \times 10^3$ | $5.8 \times 10^3$ | $1.7 \times 10^4$ | $2.4 \times 10^1$ | $3.3 \times 10^1$ |
| Liquid chemical 10 | CHN | $1.8 \times 10^5$ | $7.0 \times 10^4$ | $5.0 \times 10^3$ | $2.0 \times 10^5$ | $2.6 \times 10^0$ | $3.6 \times 10^1$ |
| Liquid chemical 11 | CHN | $2.1 \times 10^4$ | $1.2 \times 10^3$ | $2.0 \times 10^3$ | $3.9 \times 10^3$ | $1.8 \times 10^1$ | $1.1 \times 10^1$ |
| Liquid chemical 12 | CHN | $4.2 \times 10^4$ | $7.5 \times 10^3$ | $6.2 \times 10^3$ | $7.8 \times 10^3$ | $5.6 \times 10^6$ | $6.7 \times 10^0$ |
| Liquid chemical 13 | CHN | $1.6 \times 10^4$ | $1.3 \times 10^3$ | $1.1 \times 10^3$ | $2.6 \times 10^3$ | $1.2 \times 10^1$ | $1.4 \times 10^1$ |
| Liquid chemical 14 | CHN | $1.6 \times 10^4$ | $1.6 \times 10^3$ | $1.8 \times 10^3$ | $3.1 \times 10^3$ | $1.0 \times 10^1$ | $8.9 \times 10^0$ |
| Liquid chemical 15 | CHN | $1.5 \times 10^4$ | $1.8 \times 10^3$ | $9.5 \times 10^2$ | $1.9 \times 10^3$ | $8.3 \times 10^0$ | $1.6 \times 10^1$ |
| Liquid chemical 16 | PGMEA/PGME (7:3) | $1.1 \times 10^4$ | $6.0 \times 10^2$ | $5.2 \times 10^2$ | $1.5 \times 10^3$ | $1.8 \times 10^1$ | $2.1 \times 10^1$ |
| Liquid chemical 17 | nBA | $1.2 \times 10^4$ | $8.0 \times 10^2$ | $4.0 \times 10^2$ | $1.8 \times 10^3$ | $1.5 \times 10^1$ | $3.0 \times 10^1$ |
| Liquid chemical 18 | PC/PGMEA (1:9) | $1.6 \times 10^4$ | $1.1 \times 10^3$ | $8.9 \times 10^2$ | $2.3 \times 10^3$ | $1.5 \times 10^1$ | $1.8 \times 10^1$ |
| Liquid chemical 19 | PGMEA | $1.7 \times 10^4$ | $1.0 \times 10^3$ | $9.0 \times 10^2$ | $2.2 \times 10^3$ | $1.7 \times 10^1$ | $1.9 \times 10^1$ |
| Liquid chemical 20 | EL | $1.8 \times 10^4$ | $9.0 \times 10^2$ | $8.8 \times 10^2$ | $2.1 \times 10^3$ | $2.0 \times 10^1$ | $2.0 \times 10^1$ |
| Liquid chemical 21 | iAA | $1.9 \times 10^4$ | $8.5 \times 10^2$ | $8.7 \times 10^2$ | $2.5 \times 10^3$ | $2.2 \times 10^1$ | $2.2 \times 10^1$ |
| Liquid chemical 22 | MIBC | $1.5 \times 10^4$ | $1.2 \times 10^3$ | $8.6 \times 10^2$ | $2.1 \times 10^3$ | $1.3 \times 10^1$ | $1.7 \times 10^1$ |

TABLE 2-continued

| Table 2 (part 1) | Organic solvent | Configuration of metal nanoparticles | | | | | |
|---|---|---|---|---|---|---|---|
| | | Fe nanoparticles (particles/cm$^3$) | Pb nanoparticles (particles/cm$^3$) | Cr nanoparticles (particles/cm$^3$) | Ti nanoparticles (particles/cm$^3$) | Fe/Pb | Fe/Cr |
| Liquid chemical 23 | IPA | $1.4 \times 10^4$ | $1.3 \times 10^3$ | $9.1 \times 10^2$ | $2.2 \times 10^3$ | $1.1 \times 10^1$ | $1.5 \times 10^1$ |
| Liquid chemical 24 | CHN | $1.5 \times 10^7$ | $9.0 \times 10^1$ | $5.0 \times 10^1$ | $1.4 \times 10^2$ | $1.7 \times 10^5$ | $3.0 \times 10^5$ |
| Liquid chemical 25 | CHN | $1.2 \times 10^6$ | $1.3 \times 10^6$ | $4.3 \times 10^1$ | $1.8 \times 10^2$ | $9.2 \times 10^{-1}$ | $2.8 \times 10^4$ |

TABLE 3

| Table 2 (part 2) | Classification 1 of Fe nanoparticles | | | | | Classification 2 of Fe nanoparticles | | |
|---|---|---|---|---|---|---|---|---|
| | Configuration of metal nanoparticles Fe/Ti | Total of particles | | | | Particles U (the number of particles %) | Particles V (the number of particles %) | U/V |
| | | Particles A (the number of particles %) | B and particles C (the number of particles %) | A/(B + C) | High-boiling point organic compound | | | |
| Liquid chemical 1 | $4.0 \times 10^1$ | 3 | 97 | $3.1 \times 10^{-2}$ | Contained | 95 | 5 | $1.9 \times 10^1$ |
| Liquid chemical 2 | $2.5 \times 10^1$ | 2 | 98 | $2.0 \times 10^{-2}$ | Contained | 93 | 7 | $1.3 \times 10^1$ |
| Liquid chemical 3 | $3.9 \times 10^0$ | 2 | 98 | $2.0 \times 10^{-2}$ | Contained | 95 | 5 | $1.9 \times 10^1$ |
| Liquid chemical 4 | $2.0 \times 10^0$ | 4 | 96 | $4.2 \times 10^{-2}$ | Contained | 97 | 3 | $3.2 \times 10^1$ |
| Liquid chemical 5 | $1.5 \times 10^3$ | 2 | 98 | $2.0 \times 10^{-2}$ | Contained | 95 | 5 | $1.9 \times 10^1$ |
| Liquid chemical 6 | $7.0 \times 10^0$ | 3 | 97 | $3.1 \times 10^{-2}$ | Contained | 95 | 5 | $1.9 \times 10^1$ |
| Liquid chemical 7 | $4.3 \times 10^0$ | 4 | 96 | $4.2 \times 10^{-2}$ | Contained | 95 | 5 | $1.9 \times 10^1$ |
| Liquid chemical 8 | $1.4 \times 10^0$ | 3 | 97 | $3.1 \times 10^{-2}$ | Contained | 95 | 5 | $1.9 \times 10^1$ |
| Liquid chemical 9 | $1.1 \times 10^1$ | 2 | 98 | $2.0 \times 10^{-2}$ | Contained | 95 | 5 | $1.9 \times 10^1$ |
| Liquid chemical 10 | $9.0 \times 10^{-1}$ | 3 | 97 | $3.1 \times 10^{-2}$ | Contained | 96 | 4 | $2.4 \times 10^1$ |
| Liquid chemical 11 | $5.4 \times 10^0$ | 59 | 41 | $1.4 \times 10^0$ | Contained | 96 | 4 | $2.4 \times 10^1$ |
| Liquid chemical 12 | $5.4 \times 10^0$ | 11 | 89 | $1.2 \times 10^{-1}$ | Contained | 93 | 7 | $1.3 \times 10^1$ |
| Liquid chemical 13 | $6.0 \times 10^0$ | 2 | 98 | $2.0 \times 10^{-2}$ | Contained | 91 | 9 | $1.0 \times 10^1$ |
| Liquid chemical 14 | $5.2 \times 10^0$ | 3 | 97 | $3.1 \times 10^{-2}$ | Contained | 99 | 1 | $9.9 \times 10^1$ |
| Liquid chemical 15 | $7.9 \times 10^0$ | 2 | 98 | $2.0 \times 10^{-2}$ | Contained | 90 | 10 | $9.0 \times 10^0$ |
| Liquid chemical 16 | $7.3 \times 10^0$ | 2 | 98 | $2.0 \times 10^{-2}$ | Contained | 96 | 4 | $2.4 \times 10^1$ |
| Liquid chemical 17 | $6.9 \times 10^0$ | 1 | 99 | $1.0 \times 10^{-2}$ | Contained | 91 | 9 | $1.0 \times 10^1$ |
| Liquid chemical 18 | $7.0 \times 10^0$ | 1 | 99 | $1.0 \times 10^{-2}$ | Contained | 93 | 7 | $1.3 \times 10^1$ |
| Liquid chemical 19 | $7.7 \times 10^0$ | 1 | 99 | $1.0 \times 10^{-2}$ | Contained | 92 | 8 | $1.2 \times 10^1$ |
| Liquid chemical 20 | $8.6 \times 10^0$ | 2 | 98 | $2.0 \times 10^{-2}$ | Contained | 91 | 9 | $1.0 \times 10^1$ |
| Liquid chemical 21 | $7.6 \times 10^0$ | 3 | 97 | $3.1 \times 10^{-2}$ | Contained | 91 | 9 | $1.0 \times 10^1$ |
| Liquid chemical 22 | $7.1 \times 10^0$ | 2 | 98 | $2.0 \times 10^{-2}$ | Contained | 93 | 7 | $1.3 \times 10^1$ |
| Liquid chemical 23 | $6.4 \times 10^0$ | 1 | 99 | $1.0 \times 10^{-2}$ | | 92 | 8 | $1.2 \times 10^1$ |
| Liquid chemical 24 | $1.1 \times 10^5$ | 3 | 97 | $3.1 \times 10^{-2}$ | Contained | 95 | 5 | $1.9 \times 10^1$ |
| Liquid chemical 25 | $6.7 \times 10^3$ | 3 | 97 | $3.1 \times 10^{-2}$ | Contained | 95 | 5 | $1.9 \times 10^1$ |

Table 2 was shown by dividing the table into Table 2 (part 1) and Table 2 (part 2). The measurement results and the like of the respective liquid chemicals are described over the corresponding row of the above two tables. For example, regarding the liquid chemical 1, the following are shown in the tables: cyclohexanone was used as an organic solvent; a content of Fe nanoparticles was $1.2 \times 10^5$ particles/cm$^3$, a content of Pb nanoparticles was $9.0 \times 10^2$ particles/cm$^3$, a content of Cr nanoparticles was $1.5 \times 10^3$ particles/cm$^3$, and a content of Ti nanoparticles was $3.0 \times 10^3$ particles/cm$^3$; and Fe/Pb was $1.3 \times 10^2$, Fe/Cr was $8.0 \times 10^1$, and Fe/Ti was $4.0 \times 10^1$. In addition, as a classification of Fe nanoparticles, a content of particles A was 3% (on a number basis) with respect to a total number of Fe nanoparticles, a total content of particles B and particles C was 97% (on a number basis), and A/(B+C) was $3.1 \times 10^{-2}$. Furthermore, the liquid chemical 1 includes a high-boiling point organic compound, and as a classification of Fe nanoparticles, a content of particles U was 95% (on a number basis) with respect to a total number of Fe nanoparticles, a content of particles V was 5% (on a number basis), and U/V was $1.9 \times 10^1$.

The other liquid chemicals are also described in the tables in the same manner as in the liquid chemical 1.

Example 1

Defect inhibitive performance was evaluated using the above-prepared liquid chemical 1 as a pre-wetting solution. A resist composition 1 used is as follows.

[Resist Composition 1]

A resist composition 1 was obtained by mixing each component at the following composition.

Resin (A-1): 0.77 g

Acid-generating agent (B-1): 0.03 g

Basic compound (E-3): 0.03 g

PGMEA: 67.5 g

EL: 75 g

<Resin (A) and the Like>

Synthesis Example 1) Synthesis of Resin (A-1)

600 g of cyclohexanone was put in a 2 L flask, and an atmosphere was replaced with nitrogen at a flow rate of 100 mL/min over 1 hour. Thereafter, 4.60 g (0.02 mol) of a polymerization initiator, V-601 (manufactured by Wako Pure Chemical Industries, Ltd.) was added, and a temperature was raised until an internal temperature reached 80° C. Next, the following monomer and 4.60 g (0.02 mol) of a polymerization initiator, V-601 (manufactured by Wako Pure Chemical Industries, Ltd.) were dissolved in 200 g of cyclohexanone to prepare a monomer solution. The monomer solution was added dropwise over 6 hours into the flask heated to 80° C. After completion of the dropwise addition, a reaction was further performed at 80° C. for 2 hours.

| 4-Acetoxystyrene | 48.66 g (0.3 mol) |
| 1-Ethylcyclopentyl methacrylate | 109.4 g (0.6 mol) |
| Monomer 1 | 22.2 g (0.1 mol) |

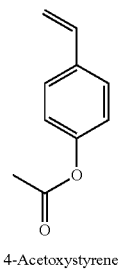

4-Acetoxystyrene

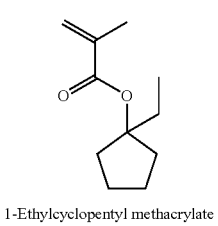

1-Ethylcyclopentyl methacrylate

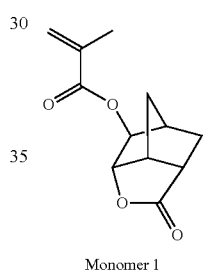

Monomer 1

The reaction solution was cooled to room temperature and added dropwise into 3 L of hexane to precipitate a polymer. The filtered solid was dissolved in 500 mL of acetone and added dropwise again into 3 L of hexane. The filtered solid was dried under reduced pressure, and thereby 160 g of a copolymer (A-1) of 4-acetoxystyrene/1-ethylcyclopentyl methacrylate/monomer 1 was obtained.

10 g of the polymer obtained above, 40 mL of methanol, 200 mL of 1-methoxy-2-propanol, and 1.5 mL of concentrated hydrochloric acid were added to a reaction container. The mixture was heated to 80° C. and stirred for 5 hours. The reaction solution was air-cooled to room temperature and added dropwise into 3 L of distilled water. The filtered solid was dissolved in 200 mL of acetone and added dropwise again into 3 L of distilled water. The filtered solid was dried under reduced pressure, and thereby a resin (A-1) (8.5 g) was obtained. A weight-average molecular weight (Mw) in terms of standard polystyrene by gel permeation chromatography (GPC) (solvent: THF (tetrahydrofuran)) was 11,200, and a molecular weight dispersity (Mw/Mn) was 1.45. A composition and the like are shown in Table 3.

TABLE 4

| Table 3 | Structure | Compositional ratio (molar ratio) from the left | Mw | Mw/Mn |
|---|---|---|---|---|
| Resin A-1 | 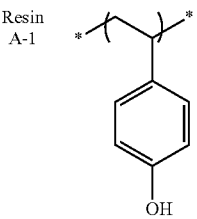 | 30/60/10 | 11,200 | 1.45 |

<Photo-Acid Generator (B)>
The following was used as a photo-acid generator.

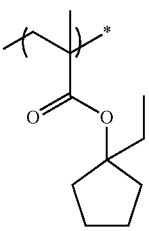
(B-1)

<Basic Compound (E)>
The following was used as a basic compound.

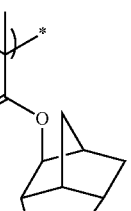
(E-3)

(Residue Defect Inhibitive Performance, Bridge Defect Inhibitive Performance, and Spot-Like Defect Inhibitive Performance)

Residue defect inhibitive performance, bridge defect inhibitive performance, and spot-like defect inhibitive performance of the liquid chemicals were evaluated by the following method. In the test, a coater developer, "RF$^{35}$" manufactured by SOKUDO was used.

First, AL412 (manufactured by Brewer Science) was applied on a silicon wafer and baked at 200° C. for 60 seconds to form a resist underlayer film having a thickness of 20 nm. The pre-wetting solution (the liquid chemicals 1 to 17 and the liquid chemicals 19 and 20) was applied thereon, and the resist composition was applied thereon and baked (Prebake: PB) at 100° C. for 60 seconds to form a resist film having a thickness of 30 nm.

This resist film was exposed through a reflective type mask having a pitch of 20 nm and a pattern width of 15 nm using an EUV exposure machine (manufactured by ASML; NXE3350, NA: 0.33, Dipole: 90°, sigma outer: 0.87, sigma inner: 0.35). Thereafter, heating was performed at 85° C. for 60 seconds (Post Exposure Bake: PEB). Next, the film was developed by an organic solvent-based developer for 30 seconds and rinsed for 20 seconds. Subsequently, by rotating the wafer at a rotation speed of 2000 rpm for 40 seconds, a line-and-space pattern having a pitch of 20 nm and a pattern width of 15 nm was formed.

An image of the above pattern was obtained, and the obtained image was analyzed. The number of residues in an unexposed part per unit area was obtained and evaluated according to the following standard (the results are shown in the column of "Residue defect inhibitive performance" in Table 4). In addition, the number of bridge-like defects between patterns was obtained and evaluated according to the following standard. This is referred to as the number of bridge defects, and the results are shown in the column of "Bridge defect inhibitive performance" in Table 4. Furthermore, EDX (energy dispersive X-ray analysis) was performed on coordinates at which defects were detected, and as a result, defects in which metal atoms were not detected were defined as spot-like defects, and these were measured. The results were evaluated according to the following standard and are shown in Table 4 in the column of "Spot-like defect inhibitive performance." In the following evaluation standard, "the number of defects" indicates each of the number of residue defects and the number of bridge defects.

AA: The number of defects was less than 30.
A: The number of defects was 30 or more and less than 60.
B: The number of defects was 60 or more and less than 90.
C: The number of defects was 90 or more and less than 120.
D: The number of defects was 120 or more and less than 150.
E: The number of defects was 150 or more and less than 180.
F: The number of defects was 180 or more.

(Pattern Width Uniform Performance)
An image of the above pattern was obtained. The obtained image was analyzed to obtain Line Width Roughness (LWR). That is, in a case of observing patterns from the top, a distance from the center to an edge of a pattern was observed at an arbitrary point, and measurement variation was evaluated by 3σ. The results were evaluated according to the following standard to evaluate pattern width uniform performance. The results are shown in Table 4.

AA: 3σ was less than 1.5 nm.
A: 3σ was 1.5 nm or more and less than 1.8 nm.
B: 3σ was 1.8 nm or more and less than 2.2 nm.
C: 3σ was 2.2 nm or more and less than 2.5 nm.
D: 3σ was 2.5 nm or more and less than 2.8 nm.
E: 3σ was 2.8 nm or more and less than 3.1 nm.
F: 3σ was 3.1 nm or more.

Examples 2 to 16 and Examples 18 to 23

Residue defect inhibitive performance, bridge defect inhibitive performance, spot-like defect inhibitive performance, and pattern width uniform performance of each of liquid chemicals were evaluated in the same manner as above except that liquid chemicals 2 to 16 and liquid chemicals 18 to 23 were used instead of the liquid chemical 1. The results are shown in Table 4.

Comparative Examples 1 and 2

Residue defect inhibitive performance, bridge defect inhibitive performance, spot-like defect inhibitive performance, and pattern width uniform performance were evaluated in the same manner as above except that liquid chemicals 24 and 25 were used instead of the liquid chemical 1. The results are shown in Table 4.

Example 17

Residue defect inhibitive performance, bridge defect inhibitive performance, spot-like defect inhibitive performance, and pattern width uniform performance of a liquid chemical 17 were evaluated in the same manner as above except that the pre-wetting solution was not used, and the liquid chemical 17 was used as a developer. The results are shown in Table 4.

TABLE 5

| Table 4 | Liquid chemical used | Residue defect inhibitive performance | Bridge defect inhibitive performance | Pattern width uniform performance | Spot-like defect inhibitive performance |
|---|---|---|---|---|---|
| Example 1 | Liquid chemical 1 | AA | AA | AA | AA |
| Example 2 | Liquid chemical 2 | AA | A | AA | AA |
| Example 3 | Liquid chemical 3 | A | A | A | A |
| Example 4 | Liquid chemical 4 | B | B | B | B |
| Example 5 | Liquid chemical 5 | B | C | B | B |
| Example 6 | Liquid chemical 6 | AA | A | A | AA |
| Example 7 | Liquid chemical 7 | A | B | A | A |
| Example 8 | Liquid chemical 8 | B | C | B | B |
| Example 9 | Liquid chemical 9 | AA | A | A | AA |
| Example 10 | Liquid chemical 10 | A | B | A | A |
| Example 11 | Liquid chemical 11 | D | C | C | C |
| Example 12 | Liquid chemical 12 | B | C | B | B |
| Example 13 | Liquid chemical 13 | AA | A | A | A |
| Example 14 | Liquid chemical 14 | C | C | D | C |
| Example 15 | Liquid chemical 15 | D | D | E | D |
| Example 16 | Liquid chemical 16 | AA | A | AA | AA |
| Example 17 | Liquid chemical 17 | AA | AA | AA | AA |
| Example 18 | Liquid chemical 18 | AA | AA | AA | AA |
| Example 19 | Liquid chemical 19 | AA | AA | AA | AA |
| Example 20 | Liquid chemical 20 | AA | AA | AA | AA |
| Example 21 | Liquid chemical 21 | AA | AA | AA | AA |
| Example 22 | Liquid chemical 22 | AA | AA | AA | AA |
| Example 23 | Liquid chemical 23 | AA | AA | AA | AA |

TABLE 5-continued

| Table 4 | Liquid chemical used | Residue defect inhibitive performance | Bridge defect inhibitive performance | Pattern width uniform performance | Spot-like defect inhibitive performance |
|---|---|---|---|---|---|
| Comparative Example 1 | Liquid chemical 24 | F | F | E | E |
| Comparative Example 2 | Liquid chemical 25 | E | E | F | F |

Example 24

A resist composition 2 that is a liquid chemical was obtained using the same method and components as in the resist composition 1 except that PGMEA: 67.5 g and EL: 75 g which were purified by the purification method for the liquid chemical 1 described in Example 1 were used instead of PGMEA: 67.5 g and EL: 75 g in the resist composition 1.

Next, regarding the resist composition 2, the number of particles contained which have a particle size of 0.5 to 17 nm in the liquid chemical was evaluated by the same method as described above, and the number thereof was the same as that of Example 1.

In addition, a pattern was formed by the same method as in Example 1 except that the resist composition 2 was used, and the pre-wetting solution was not used. In a case where residue defect inhibitive performance, bridge defect inhibitive performance, pattern width uniform performance, and spot-like defect inhibitive performance were examined, the results were the same as those in Example 1.

The results in Table 4 show that the liquid chemicals of Examples 1 to 16 and Examples 18 to 23 exhibited excellent residue defect inhibitive performance, excellent bridge defect inhibitive performance, excellent pattern width uniform performance, and excellent spot-like defect inhibitive performance in the case where the liquid chemicals were used as the pre-wetting solutions.

In addition, the results in Table 4 show that the liquid chemical of Example 17 exhibited excellent residue defect inhibitive performance, excellent bridge defect inhibitive performance, excellent pattern width uniform performance, and excellent spot-like defect inhibitive performance in the case where the liquid chemical was used as the developer.

Furthermore, the liquid chemical of Example 29 exhibited excellent residue defect inhibitive performance, excellent bridge defect inhibitive performance, excellent pattern width uniform performance, and excellent spot-like defect inhibitive performance as the resist solution.

Furthermore, the liquid chemical 1 in which Fe/Cr was 1.0 or more exhibited more excellent bridge defect inhibitive performance, more excellent pattern width uniform performance, and more excellent spot-like defect inhibitive performance, as compared to those of the liquid chemical 7.

Furthermore, the liquid chemical 1 in which F/C was $1.0 \times 10^4$ or less exhibited more excellent bridge defect inhibitive performance, more excellent pattern width uniform performance, and more excellent spot-like defect inhibitive performance, as compared to those of the liquid chemical 5.

In addition, the liquid chemical 1, in which a ratio of the number of the particles A contained to a total of the number of the particles B contained and the number of the particles C contained based on the number of the particles per unit volume of the liquid chemical was less than 1.0, exhibited more excellent bridge defect inhibitive performance, more excellent pattern width uniform performance, and more excellent spot-like defect inhibitive performance, as compared to those of the liquid chemical 11.

Furthermore, the liquid chemical 1 in which A/(B+C) was $1.0 \times 10^{-1}$ or less exhibited more excellent bridge defect inhibitive performance, more excellent pattern width uniform performance, and more excellent spot-like defect inhibitive performance, as compared to those of the liquid chemical 12.

Furthermore, the liquid chemical 1 in which UN was $1.0 \times 10^1$ or more exhibited more excellent bridge defect inhibitive performance, more excellent pattern width uniform performance, and more excellent spot-like defect inhibitive performance, as compared to those of the liquid chemical 15.

EXPLANATION OF REFERENCES

10: purification device
11: production tank
12(*a*), 12(*b*): filter unit
13: filling device
14: pipe line
15(*a*): adjustment valve
16: filtration device

What is claimed is:

1. A liquid chemical comprising:
an organic solvent;
Fe nanoparticles containing a Fe atom and having a particle size of 0.5 to 17 nm; and
Pb nanoparticles containing a Pb atom and having a particle size of 0.5 to 17 nm,
wherein a ratio of the number of the Fe nanoparticles contained to the number of the Pb nanoparticles contained is 1.0 to $1.0 \times 10^4$, based on the number of the particles per unit volume of the liquid chemical and
the organic solvent is at least one selected from the group consisting of propylene glycol monoethyl ether (PGME), propylene glycol monopropyl ether, propylene glycol monomethyl ether acetate (PGMEA), methyl methoxypropionate, diisoamyl ether, isoamyl acetate, cycloheptanone and 2-heptanone.

2. The liquid chemical according to claim 1, further comprising:
Cr nanoparticles containing a Cr atom and having a particle size of 0.5 to 17 nm,
wherein a ratio of the number of the Fe nanoparticles contained to the number of the Cr nanoparticles contained is 1.0 to $1.0 \times 10^4$, based on the number of the particles per unit volume of the liquid chemical.

3. The liquid chemical according to claim 2, further comprising:
Ti nanoparticles containing a Ti atom and having a particle size of 0.5 to 17 nm,
wherein a ratio of the number of the Fe nanoparticles contained to the number of the Ti nanoparticles contained is 1.0 to $1.0 \times 10^3$, based on the number of the particles per unit volume of the liquid chemical.

4. The liquid chemical according to claim 2, which is for manufacturing a semiconductor device.

5. The liquid chemical according to claim 2,
wherein the Fe nanoparticles consist of at least one selected from the group consisting of particles A consisting of a simple substance of Fe, particles B consisting of an oxide of a Fe atom, and particles C consisting of a simple substance of Fe and an oxide of a Fe atom.

6. The liquid chemical according to claim 5,
wherein a ratio of the number of the particles A contained to a total of the number of the particles B contained and the number of the particles C contained is $1.0 \times 10^{-3}$ or more and less than 1.0, based on the number of the particles per unit volume of the liquid chemical.

7. The liquid chemical according to claim 6,
wherein the ratio of the number of the particles contained is $1.0 \times 10^{-3}$ or more and $1.0 \times 10^{-1}$ or less.

8. The liquid chemical according to claim 2, further comprising:
an organic compound having a boiling point of 300° C. or higher.

9. The liquid chemical according to claim 1, further comprising:
Ti nanoparticles containing a Ti atom and having a particle size of 0.5 to 17 nm,
wherein a ratio of the number of the Fe nanoparticles contained to the number of the Ti nanoparticles contained is 1.0 to $1.0 \times 10^3$, based on the number of the particles per unit volume of the liquid chemical.

10. The liquid chemical according to claim 1, which is for manufacturing a semiconductor device.

11. The liquid chemical according to claim 1,
wherein the Fe nanoparticles consist of at least one selected from the group consisting of particles A consisting of a simple substance of Fe, particles B consisting of an oxide of a Fe atom, and particles C consisting of a simple substance of Fe and an oxide of a Fe atom.

12. The liquid chemical according to claim 11,
wherein a ratio of the number of the particles A contained to a total of the number of the particles B contained and the number of the particles C contained is $1.0 \times 10^3$ or more and less than 1.0, based on the number of the particles per unit volume of the liquid chemical.

13. The liquid chemical according to claim 12,
wherein the ratio of the number of the particles contained is $1.0 \times 10^3$ or more and $1.0 \times 10^{-1}$ or less.

14. The liquid chemical according to claim 1, further comprising:
an organic compound having a boiling point of 300° C. or higher.

15. The liquid chemical according to claim 14,
wherein at least some of the Fe nanoparticles are particles U containing the organic compound.

16. The liquid chemical according to claim 14,
wherein at least some of the Fe nanoparticles are the particles U containing the organic compound and particles V not containing the organic compound, and
a ratio of the number of the particles U contained to the number of the particles V contained is $1.0 \times 10^1$ or more, based on the number of the particles per unit volume of the liquid chemical.

17. The liquid chemical according to claim 1,
wherein the organic solvent is at least one selected from the group consisting of propylene glycol monoethyl ether (PGME), propylene glycol monopropyl ether, propylene glycol monomethyl ether acetate (PGMEA), methyl methoxypropionate, diisoamyl ether, and isoamyl acetate.

18. The liquid chemical according to claim 1,
wherein the organic solvent is at least one selected from the group consisting of propylene glycol monoethyl ether (PGME) and propylene glycol monomethyl ether acetate (PGMEA).

19. The liquid chemical according to claim 1,
wherein the organic solvent is at least one selected from the group consisting of isoamyl acetate, cycloheptanone and 2-heptanone.

20. The liquid chemical according to claim 1,
wherein the organic solvent is at least one selected from the group consisting of propylene glycol monopropyl ether, methyl methoxypropionate, and diisoamyl ether.

* * * * *